(12) United States Patent
Banadaki et al.

(10) Patent No.: US 11,121,279 B2
(45) Date of Patent: Sep. 14, 2021

(54) ELECTRICALLY CONTROLLABLE AND TUNABLE ELECTROMAGNETIC-FIELD ABSORBER/EMITTER USING GRAPHENE/2D MATERIAL MULTILAYER NANOSTRUCTURES

(71) Applicants: Yaser Banadaki, Baton Rouge, LA (US); Jonathan Dowling, Baton Rouge, LA (US); Safura Sharifi, Baton Rouge, LA (US)

(72) Inventors: Yaser Banadaki, Baton Rouge, LA (US); Jonathan Dowling, Baton Rouge, LA (US); Safura Sharifi, Baton Rouge, LA (US)

(*) Notice: Subject to any disclaimer, the term of this patent is extended or adjusted under 35 U.S.C. 154(b) by 16 days.

(21) Appl. No.: 16/714,711

(22) Filed: Dec. 14, 2019

(65) Prior Publication Data

US 2021/0184065 A1    Jun. 17, 2021

(51) Int. Cl.
*H01L 31/072* (2012.01)
*H01L 31/18* (2006.01)
*H02S 10/20* (2014.01)
*H01L 31/0216* (2014.01)
*H02S 10/30* (2014.01)
*G02F 1/025* (2006.01)

(52) U.S. Cl.
CPC ............ *H01L 31/072* (2013.01); *G02F 1/025* (2013.01); *H01L 31/02167* (2013.01); *H01L 31/1804* (2013.01); *H02S 10/30* (2014.12)

(58) Field of Classification Search
CPC . G01F 1/25; G01F 1/29; H01L 31/072; H01L 31/02167; H01L 31/1804
See application file for complete search history.

(56) References Cited

U.S. PATENT DOCUMENTS

2019/0243208 A1* 8/2019 Peng ..................... G02F 1/29

OTHER PUBLICATIONS

Liu et al., Direct Growth of Graphene/Hexagonal Boron Nitride Stacked Layers, American Chemical Society, Nanoletters, pp. 2032-2037 (Year: 2011).*
Ma et al., The dimensionality effect on phono nlocalization in graphene/hexagonal boron nitride superlattices, 2D Materials, vol./Issue 7, 035029 pp. 1-8 (Year: 2020).*
(Continued)

*Primary Examiner* — Jayne L Mershon
(74) *Attorney, Agent, or Firm* — Patrick Mixon

(57) ABSTRACT

An electrically controllable and tunable electromagnetic-field absorber/thermal emitter is invented using graphene/two-dimensional materials based multilayer nanostructures that have the absorption efficiency of unity at mid-infrared wavelengths. Alternating layers of graphene and hexagonal boron nitride are deposited between support materials and grown on a substrate. Tungsten may be used as the substrate, and silicon carbide as the support material; or, silicon may be used as the substrate and tungsten disulfide as the support material depending on the operating frequencies and ambient temperature. The invention demonstrates a selectable, tunable and switchable electromagnetic-field absorption or thermal emission by changing a DC bias that alters the chemical potential of the graphene layers and thereby the optical response of the multilayer nanostructures.

10 Claims, 17 Drawing Sheets

(56) References Cited

OTHER PUBLICATIONS

Hu et al., "Realizing near-perfect absorption at visible frequencies," Optical Society of America, vol. 17, No. 13, Jun. 22, 2009.
Keshava, et al., "Design of a Perfect Black Absorber at Visible Frequencies Using Plasmonic Metamaterials," Advanced Materials, p. 5410-5414, 2011.
Devarapu, et al., "Broadband Mid-Ir superabsorption with aperiodic polaritonic photonic crystals," 14012-1 to 14012-4, Mar. 6, 2014.
Li and Chen, "Atomically Thin Boron Nitride: Unique Properties and Applications," Advanced Functional Materials 26, p. 2594-2608, 2016.
Henninger, Johan, "Solar Absorptance and Thermal Emittance Data of Some Common Spacecraft Thermal-Control Coatings," GSC, NASA Ref. 1121, Apr. 1984.
Lou, et al., "A unified theory for perfect absorption in ultra-thin absorptive films with constant tangential electric of magnetic field," Coll. of Physics, Optele and Energ.
Gusynin, et al., "Magneto-optical conductivity in Graphene," p. 1-28, Cond-Mat.mes-hall/ May 25, 2007.
Senegal, Peter, "Numerical Optimization Using the Gen4 Micro Genetic Agorithm Code," Draft Maunscript, Engine Research Center, University of Wisconsin-Madison, Aug. 2000.
Zhang, Xiao, "Simulation, Fabrication and Measurement of Graphene Based Passive Guided Devices," Thesis, University of Manchesterfor PhD, 2016.
Lui, et al., "Taming the Blackbody with Infrared Metamaterials as Selective Thermal Emitters," Physical Review Letters, Jul. 22, 2011.
Lui, et al., "Infrared Perfect Absorbre and Its Application as Plasmonic Sensor," Lui et al., NANO Letters, DOI: 101.1021, p. 2342-48.
Chan, et al., Toward high-energy-density, high-efficiency, and moderate-temperature chip-scale thermophotovoltaics, PNAS, Nov. 27, 2012.
Basu, et al., "Microscale radiation in thermophotovoltaic devices—A review" International Journoal of Energy Research, Jul. 25, 2006.
Hitoshi, et al., "High-Temperture resistive surface grating for spectral control of there=mal radiation," Applied Physics Letters, Mar. 10, 2003.
Wang and Wang, "Perfect selective metamaterial solar absorbers," Optical Society of America, Nov. 4, 2013.
Moelders, et al., "Desiging Thermally Uniform Mems Hot Micro-Bolometers" Cambridge University Press Feb. 1, 2011.
Brucoli, et al., "High efficiencey quasi-monochromatic infrared emitter," Applied Physics Letters, Feb. 24, 2014.
Otey, et al., "Thermal Rectification through Vacuum," Physical Rview Letters, vol. 104, issue 15, Apr. 16, 2010.
Lui, et al., "Thermal plasmonic interconnects in graphene," Physical Review, B90, 195411, Nov. 10, 2014.
Molesky, et al., "High temperature epsilon-near-zero and eplisson-near-pole metamaterial emittters for thermophotovoltaics," Optical Society of America, Dec. 4, 2012.
Wang and Feng, "Omnidirectional thermal emitter based on phasmonic nanoantenna arrays," Optical SOciety of America, Jan. 13, 2014.
Miyazaki, "Dual-band infrared metasurface thermal emitter for $CO_2$ sensing," Applied Physics Letters 105, p. 121107-1 to 121107-4, Sep. 23, 2014.
Pendry, et al., "Magnetism from Conductors and Enhanced Nonlinear Phenomena," IEEE Transactions on Microwave Theory and Techniques, vol. 47, No. 11, p. 2075-2084, Nov. 1999.
Aydin, et al., "Broadband polarization-independent resonant light absorption using ultrathin plasmonic super absorbers," Nature Communications, Nov. 1, 2011.
Streyer, et al., "Engineering absorption and blackbody radiation in the far-infrared with surface phonon polaritons on gallium phsophide," Applied Physics Letters 104, (2014).
Inoue, et al., "Realization of narrowband thermal emission with optical nanostructures," Optica, vol. 2, No. 1, Jan. 14, 2015.
Cong, et al., "The ratio of the kinetic inductance to the geometric inductance: a key parameter for the frequency tuning of the THZ semiconductor split-ring,"Optical, 2013.
Yeng, et alll., "Global optimization of omnidirectional wavelength selective emitters/absorbers on dielectric-filled . . . " Optics Express, Optical Society of America, Aug. 2014.
Veronis, et al., "Metallic photonic crystals with strong broadband absorption at optical frequencies over wide angular range," Journal of Applied Physics 97, Apr. 22, 2005.
Rinnerbauer, et al., "High-temperatre stability and selective thermal emission of polycrystalline tantalum photonic cystals," Optics Express, May 3, 2013.
Pralle, et al., "Photonic crystal enhanced narrow-band infrared emitters," Applied Physics Letters, vol. 81, p. 4685-4685, Dec. 16, 2002.
Miyazaki, et al.,"Theremal emission of two-color polarized infrared waves from integrated plasmon cavities," Applied Physics Letters 92,p. 141114-1 to 141114-3, Apr. 11, 2008.
Biener, et al., , "Highly coherent thermal emission obtained by plasmonic bandgap structures," Applied Physics Letters 92, 81913-1 to 81913-3, Feb. 27, 2008.
Liu, et al., "Perfect Thermal Emission by Nan2007ascale Transmission Line Resonators," Nano Letters, p. 666-672, 2017.
Liu, et al., "Resonant Thermal Ifrared Emitters in Near- and Far-Fields," ACS Photonics, p. 1552-1557, 2017.
Puscasu and Schalch, "Narro-band, tunable infeared emission from arrays of microstrip patches," Applied Physics Letters 98, Jun. 10, 2008.
Smith and Wasserman, "Strong absorption and selective thermal emission from a midinfrared metamaterial," Applied Physics Letters 98, 241106-1 to 241105-3, (2011).
Abbas, et al., "Angle and polarization independent narrow-band thermal emitter made of metallic disk on SO2," Applied Physics Letters 98, 121116-1 to 121116, 2011.
Wu, "Metamaterial-based integrated plasmonic absorber/emitter for solar thermo-photovoltaic systems," Journal of Optics, p. 1-7, Jan. 12, 2012.
Raphaeli, et al., "Ultrabroadband Photonic Structures to Acheive High-Performance Daytime Radiative Cooling," NANO Letters, p. 1457-61, 2013.
Falkovsky and Varlamov, "Space-time dispersion of graphene conductivity," The European Physical Journal B, 56, p. 281-284, 2007.
Falkovsky and Pershoguba, "Optical far-infrared properties of aagraphene nonolayer and multilayer," Physical Review B 76, p. 153410-1 to 153410-4, 2007.
Novoselov, et al., "A roadmap for graphene," Review, p. 192-200, 2012.
Fleming, et al., "All-metallic three-dimensional photonic crystals swiht a large infrared bandgap," letters to nature, p. 52-55, May 2, 2002.
Yan, et al., "Tunable infrared plasmonic devices using graphene /insulator stacks," Letters, p. 330-334, May 7, 2012.
Mattiucci, et al., "Taming the thermal emissivity of metals: A metamaterial approach," Appied Physics Letters, May 16, 2012.
Gusynin, et al., "Magneto-optical conductivity in graphene," Journal of Physics: Condensed Matter 19, Dec. 15, 2006.
Singh, et al., "Nonlinear Optical Properties of Hexagonal Silicon Carbide," p. 53-56, Oct. 22, 2003.
Perea, et al., "Optical constants of electron-beam evaporated boron firns in the 6.8-900 eV photon energy range," Journal of the Optical Society of America A, Jan. 2008.
Devarapu and S. Foteinpopuoulou Mid-IR near-perfect absorption with a SiC photonicc crystal with angle-controlled polarization selectivity, Optical Society of America, 2012.
Sendergaard and Bozhevolny, "Theoretical Analysis of Plaasmonic Black Gold: Periodic arroays of ultra-sharp grooves," New Journal of Physics 15, 2013.
Schuller, et al., "Optical antenna thermal emitters," Nature Photonics, vol. 3, p. 658-661, Nov. 2009.
Stenzel, et al., "Ehnhancement of the photovoltaic conversion efficiency of copper phathalocyanine thin film devices by incorporation of metal clusters," Solar Energy, Dec. 1994.

(56) References Cited

OTHER PUBLICATIONS

Westphalen, et al., "Metal CLuster enhanced organic solar cells," Solar Energy Materials and Solar Cells, p. 97-105, 2007.

Lin, et al., "Origin of absortion enhancement in a tungsten, three-dimenisional photonic crystal," OSA Publishing, 2003.

Sharma, et al., "Optical and Electrical Properties of Nanostructured Metal-Silicin-Metal Photodetetectors," Journal of Quantum Electronics, vol. 38, No. 12, p. 1651-1660, Dec. 2002.

Huang, et al., "Long Wavelentgh Resonant Cavity Photodetector Based on InP/Air-Gap Bragg Reflectors," IEEE Photonics Technology Letters, vol. 16, No. 1, Jan. 2004.

Tittl, et al., "Palladium-BasednPlamonic Perfect Absorber in the Visible Wave Range and Its Application to Hydrogen Sensing," NANO Letters, Aug. 30, 2011.

Hendrickson, et al., "A wide-band perfect light absorber at midwave infrared using multiplexed metal sstructures,".

Laroche, et al., "Coherent Theermal Antenna Using a Photonic Crystal Slab," Physical Review Letters, p. 123903-1 to 123903-4, Mar. 31, 2006.

Smith et al., "Experimental and theoretical results for a two-dimensional metal photonic band-gap cavity," Applied Physics Letters, p. 645-647, Aug. 1, 1994.

Brown and McMahon, "Large electromagnetic stop bands in metal-lodielectric photonic ctrystals," p. 2138-2140, Oct. 9, 1995.

Celanovic, et al. "Two-dimensional tungsten photonic crystals as selective thermal emitters," Applied Physics Letters, p. 193101-1 to 193101-3, 2008.

Reif, "Fundamentals of Statistical and Thremal Physics," Jan. 5, 2009.

Laroch, et al., "Tailoring silicon radiative properties," Optics Communications, p. 316-320, 2005.

Wang, et al., Spatial and temporal coherence of thermal radiation in asymmetric Faby-Perot resonance cavities, p. 3024-3031, 2009.

Wang, et al., "Direct Measurement of Thermal Emission form a—Perot Cavity Resonator," Journal of Heat Transfer, vol. 134, 2012.

Lin, et al., "Three-dimensional photonic-crystal emitter for thermal photovoltaic power generation," Applied Physics Letters, vol. 83, p. 380-382.

Hitoshi, et al., :Thermophotovaltaic gemeration with selective radiators based ontungsten surface gratings, Applied Physics Letters, V. 16, p. O. 85 No. 16, p. 3399-3401.

\* cited by examiner

ELECTRICALLY CONTROLLABLE AND TUNABLE ELECTROMAGNETIC-FIELD ABSORBER/EMITTER USING GRAPHENE/2D MATERIAL MULTILAYER NANOSTRUCTURES

FIELD OF THE INVENTION

This invention generally relates to graphene and, more particularly, the invention relates to the application of graphene in controlling electromagnetic waves.

BACKGROUND OF THE INVENTION

Thermal emitters generally exhibit a broad spectrum determined by Planck's law and are used for various applications over a broad range of frequencies. A perfect thermal emitter is one that follows Planck's law of blackbody radiation. Planck's law describes the spectral density of electromagnetic radiation emitted by a black body in thermal equilibrium at a given temperature, T, when there is no net flow of matter or energy between the body and its environment. A blackbody is an idealized object that absorbs all radiation incident upon it and re-radiates energy-based temperature solely, as described by Planck's law. In reality, no object behaves like an ideal black-body. Instead, the emitted radiation of a material is determined by determining the absorption of the material. The desire to control radiated energy has long been a research topic of interest for scientists. Many prior art efforts focus on constructing a selective emitter (e.g., a "thermal emitter") whose thermal radiation is much narrower than that of a blackbody at the same temperature.

For example, it is desirable to control the optical coating on an object to manage the object's thermal signature. How well an optical coating performs is dependent upon a number of factors, including the number of layers, the thickness of each layer and the differences in refractive index at the layer interfaces.

It is also desirable to have an emitter that radiates only within a certain frequency bandwidth, i.e., a selective emitter. Selective emitters are useful for various applications, including influencing infrared sensing, thermal imaging, and thermophotovoltaics. For instance, the thermal radiations of naval vessels and aircrafts can be detectable in a wide range of frequencies. It would be desirable to have a tunable material that may control the thermal radiation emitted by the ships to enable the vessels and aircrafts to avoid detection.

In the case of thermophotovoltaic power generation, thermal emission in a frequency range below the bandgap of the photovoltaic cell passes through the cell without being absorbed, leading to the reduction of the power conversion efficiency. Therefore, there is a strong motivation to realize narrowband thermal emission with high emissivity (the ratio of the thermal emission intensity from an object to that from a blackbody) at a target wavelength while suppressing it as much as possible at all other wavelengths.

The principle of thermal emission control is based on Kirchhoff's law of thermal radiation, which states that the emissivity of an object is equal to the absorptivity for a given frequency, direction, and polarization. Therefore, in order to realize a narrowband thermal emission spectrum, we have to maximize the absorptivity of the emitter only at a target wavelength while minimizing it at all other wavelengths. One approach for obtaining narrowband absorptivity (emissivity) is the direct use of materials such as rare earth oxides, which inherently cause strong absorption at fixed wavelengths. However, this approach does not allow for the arbitrary control of an emission wavelength or an emission bandwidth Various thermal emitters are desired for energy harvesting applications, such as in the field of thermophotovoltaics (TPVs), in that the conversion efficiently can be significantly enhanced. Extensive efforts have been made using the luminescent bands of rare earth oxides for selective emission. However, such selective emitters are limited by the availability of materials and cannot be controlled beyond mixing various compounds, thus limiting their performance. Another proposed technology that may be relevant for thermophotovoltaic applications is metamaterial. Metamaterials (MMs) are composed of nanostructures, called artificial atoms, which can give metamaterials extraordinary properties that cannot be found in natural materials. The nanostructures themselves and their arrangements determine the metamaterials' properties.

Metamaterials have demonstrated the ability to achieve exotic properties difficult to attain with natural materials. For example, the negative refractive index, invisibility cloaks, perfect lenses, super-lenses, hyper-lenses, and super-resolution imaging, negative index materials, invisibility cloaking, perfect absorbers, meta-holograms, artificial chirality, and electromagnetically-induced transparency are examples of MM applications that have properties that do not occur in normal materials. However, before MMs can be used in practical ways, several challenges must be overcome. For example, in conventional MMs, where the arrangements of nanostructures are fixed, the MMs may have fixed properties, which limits their use. Consequently, the properties of two-dimensional MMs have sparked much interest.

In addition, two-dimensional (2D) graphene materials fabricated experimentally in 2004 by Geim et al., have been arousing tremendous interest in condensed matter physics due to their superior electronic and optical properties, such as the unique quantum Hall effect, high mobility, Klein tunneling, dynamic graphene conductivity, and so on. Graphene is a two-dimensional planar layer of carbon atoms packed in a honeycomb lattice. Photonic and optoelectronic applications depend on the high optical absorption of atomic graphene with interaction between the propagating photons and the graphene. The tunable optical reflectivity, transmissivity, and absorptivity have been investigated in many graphene-based systems, such as graphene nanodisc arrays, graphene nanoribbons, alternating dielectric media with graphene layers sandwiched between them, graphene-based Salisbury screens, stacked graphene pairs or graphene photonic crystals, etc.

In a multilayer structural system, the optical transport properties and transmission are dependent on the number of dielectric and graphene layers, the dielectric space thickness, the incident angle, the incident light wavelength (or frequency) which is located in different graphene intra-band and/or inter-band optical transition regions, the surface plasmon-polaritons, and the transverse electric/transverse magnetic (TE/TM) modes. So many factors can be used to tune the optical properties of graphene-based dielectric structure systems, which can meet the requirements of optoelectronic applications. As an example, Sensale-Rodriguez et al. designed structures on "SiO2/Si" dielectric substrates coated with graphene. Additionally, because the graphene monolayer material is inserted between two dielectric layers, the optical transport properties can be tuned by the gate voltage (or graphene Fermi energy) for the occurrence of the graphene surface conductivity.

At finite temperatures, all materials emit electromagnetic radiation due to the thermally induced motion of particles and quasiparticles. A perfect thermal emitter is one that follows Planck's law of blackbody radiation. Planck's law describes the spectral density of electromagnetic radiation emitted by a black body in thermal equilibrium at a given temperature T when there is no net flow of matter or energy between the body and its environment. The perfect thermal emitter is one that is broadband, incoherent and isotropic, with a spectral profile and an intensity that are dependent on the emissivity of the material, and that varies only with changes in temperature.

The basic method to achieve narrowband absorptivity (emissivity) is the direct use of rare earth oxides, which inherently cause strong absorption at fixed wavelengths. However, the arbitrary control of an emission wavelength or an emission bandwidth is limited to the properties of chosen materials that determine the magnitude of interaction between light and materials. A selective emitter can be achieved by photonic bandgaps in photonic crystals composed of metallic and dielectric structures. As electromagnetic fields are strongly attenuated below the plasma frequency of metals, they introduce more flexibility in creating a thermal emitter with broadband frequency selectivity. Also, metals are potentially suitable for near-infrared selective thermal emitters, since they have large absorption in the near-infrared frequencies with stable properties at high temperatures. However, metals have also high reflectivity in mid- and far-infrared frequencies and consequently, structures composed of metals can potentially show a low emissivity. As such, the surface is required to be modified periodically by an array of grooves or holes to enhance emission at infrared frequencies. In this way, the radiative and absorptive rate of the photonic crystal resonances dictates the emissivity spectrum so that the geometrical parameters enable a broadband, selective thermal emitter.

A narrowband thermal emission can be achieved using metallic nanostructures so that the optical resonant modes, confined in the so-called Salisbury screen and Fabry-Perot cavity, are excited on the metal surface, leading to enhanced absorptivity (emissivity) at those resonant wavelengths. According to the Purcell effect, thermal radiation from an optical resonator can be dramatically modulated by the resonance mode designed in the infrared range, leading to narrowband thermal emission at the resonant frequency. Liu et al. demonstrated that the matched mode of the emitter can be lost when the resonance mode is electrically quasi-static, i.e. the electric field oscillates in phase, resulting in the fundamental limit of the spectral thermal emission power from an optical resonator.

Metamaterials based structures have also led to narrowband thermal emission. The effective permittivity and permeability of the entire structure are artificially controlled by combining subwavelength metallic elements with thin dielectric layers in a properly designed structure, leading to perfect absorption (maximum emission) at the resonant wavelengths. It should be noted, however, that strong free carrier absorption due to metals leads to undesired emission over an extensive wavelength range, together with the broadening of the emission peaks in selective thermal emitters designed by photonic crystals and metamaterials. In addition, a narrowband resonance achieved in these structures cannot be changed dynamically to other operation frequencies due to the limitation in the properties and functionalities of available conventional metals.

Infrared frequency-tunable coherent thermal emitters play an essential role in material analysis, providing noninvasive information on chemical composition and bonds. The dynamic control of thermal radiation has been demonstrated through in situ modification of material emissivity. This can be achieved with nanophotonic structures that incorporate phase change materials so that the emissivity can be electronically manipulated by controlling the charge injection, and consequently the polariton modes in the structure. Cong et al. demonstrated that a tunable selective absorber can be designed by InSb, whose carrier density can be adjusted by utilizing an optical pump or changing the surrounding temperature, altering the resonance frequency of split rings.

It has been demonstrated that multilayer structures modify the absorption spectra of bulk materials, which is important for many applications involving metallic gratings, metallic and semiconductor photonic crystals, periodic grooves, and nano-antennae. Unusual absorption characteristics in the infrared wavelength range are important for many applications such as photovoltaics, control of thermal radiation, photodetectors, and chemical sensing.

What is needed is a multilayer structure that not only enables narrowband thermal emission at mid-infrared wavelengths but also provides tunable and switchable thermal emitters.

BRIEF SUMMARY OF THE INVENTION

The present innovation is an electrically controllable and tunable electromagnetic field absorber/emitter using graphene multilayer nanostructure (e.g., "graphene multilayer nanostructure"). The graphene multilayer nanostructure of the present invention comprises an aperiodic heterostructure of graphene for absorbing electromagnetic waves at infrared frequencies. The structure of the present invention comprises alternating layers of graphene and hexagonal boron nitride (also called. "white graphite"), which are bookend on both sides by a layer of silicon carbide. That is, the alternating layers of graphene and hexagonal boron nitride are included in between a first and second layer of silicon carbide. The alternating layers of graphene and hexagonal boron nitride, including a layer of silicon carbide on both ends, is constructed on a layer of tungsten.

The graphene multilayer nanostructure taught, herein, includes a perfect absorption efficiency of unity at the peak mid-infrared frequency of 3.34 μm and a selective frequency bandwidth of 315 nm. In accordance with the invention, the absorption efficiency of the graphene multilayer nanostructure may be shifted (e.g. tuned) by changing the chemical potential in the aperiodic heterostructure of graphene. In addition to the tunable properties of our proposed heterostructure of graphene structure, the strength of absorption of the structure can be also altered by changing the chemical potential of heterostructure of graphene resulting in a switchable radiation absorber.

Further still, the graphene multilayer nanostructure of the present invention can be used in generating encrypted signals using the thermal radiations of naval vessels or aircrafts. For example, the graphene multilayer nanostructure can be electrically switched on or off, and tuned to other frequencies to control the detectable range of transparent frequencies using a DC bias. The graphene multilayer nanostructure can make thermal emission opaque and therefore undetectable to a first detector when the absorption coefficient of the graphene multilayer nanostructure is zero (switch off) in a broad range of frequencies. On the other hand, that same graphene multilayer nanostructure may generate a thermal emission that may also remain transparent to a second detector in a narrow bandwidth of 315 nm when the absorption coefficient is unity (switch on). By tuning the transparent frequencies, the multilayer graphene nanostructure may generate a predetermined thermal radiation signal between an object and the first or second detectors in friend-or-foe (FOF) applications.

The multilayer graphene nanostructures of the present invention may be used to disguise the thermal radiation of objects within a wide range of infrared tetra hertz (THz) frequencies to conceal the objects from enemy aircrafts, while also serving as an encrypted and detectable signal within a very narrow frequency range for trusted detectors. In this context, a "trusted detector" may be a detector that is designed to detect the thermal radiation (e.g., "thermal signature."). As such, the multilayer graphene nanostructures of the present invention may control thermal radiation at time scales at a much faster rate than the spontaneous emission rate for conventional light-emitting diodes and classical blackbody emission sources. For example, according to the present invention, the frequency range at which the thermal signature produced by the multilayer graphene nanostructure is detectable depends on the number and thickness of the graphene layers used in the nanostructure, as discussed more fully below.

It is well known that the spectral features of controlled thermal emission (e.g., wavelength, bandwidth, peak emissivity, and angular characteristics) of nanostructures are strongly dependent on the materials and structures chosen for the emitters/absorbers. The present invention uses graphene, an atomic layer of carbon, in a multilayer structure for controlling thermal emittance of an object at infrared wavelengths. It is well known that graphene is a zero-bandgap semi-metal with high carrier mobility at room temperature. The high carrier mobility of graphene at room temperature facilitates strong interaction between the graphene and terahertz (THz) to mid-infrared (MIR) frequency waves.

The propagation of these THz and MIR frequency waves through the graphene can be actively controlled by varying the chemical potential in graphene. For example, it is well known that the chemical potential of the graphene can be controlled (e.g., tuned) by chemical doping, voltage bias, external magnetic field, or optical excitation. Further, it is also known that graphene has low single-pass optical absorption due to its single-atom-layer thickness. Thus, total absorption by graphene can be only achieved by novel designs of graphene-based nanostructures. That is, in accordance with various aspects of this invention, the graphene-based thermal emitter or electromagnetic absorber of the present invention can be controlled electrically to absorb or not absorb the electromagnetic waves in infrared frequencies.

The present invention comprises an electrically controllable thermal emitter using an aperiodic heterostructure of graphene, wherein the thermal emitter is controllable at infrared frequencies. The aperiodic heterostructure of graphene absorber according to the present invention, has an absorption efficiency of unity at narrowband infrared frequencies (700 nanometers (nm) to 1 millimeter (mm)). The absorption efficiency of the heterostructure of graphene can be shifted by changing the chemical potential in graphene. In addition to the tunable properties of our device, the strength of emission can also be altered resulting in a switchable thermal emitter.

The invention further includes:
1. An aperiodic graphene multilayer nanostructure comprising:
   a. a support substrate comprised of tungsten (W), wherein the tungsten substrate includes a planar surface;
   b. a first silicon carbide (SiC) layer in contact with the tungsten substrate planar surface, wherein the first silicon carbide layer includes a planar surface;
   c. n number of graphene layers is alternated with (n−1) number of hexagonal boron nitride (hBN) layers, wherein at least one of the n number of graphene layers is in contact with the first silicon carbide layer planar surface, wherein at least one of the n number of graphene layers includes a planar surface, wherein each one of the n number of graphene layers includes a distinct thickness; wherein each one of the (n−1) number of hexagonal boron nitride layers includes a distinct thickness, and
   d. a second silicon carbide layer in contact with the at least one of the n number of graphene layers planar surface, wherein the second silicon carbide layer is in contact with air.
2. An aperiodic graphene multilayer nanostructure according to claim 1, wherein a genetic optimization algorithm is used to determine, the n number of graphene layers, and the distinct thickness for each of the n number of graphene layers, to ensure that graphene multilayer nanostructure has an absorption efficiency of unity at its peak mid-infrared frequency.
3. An aperiodic graphene multilayer nanostructure comprising:
   a. a support substrate comprised of silicon (Si), wherein the silicon substrate includes a planar surface;
   b. a first tungsten disulfide ($WS_2$) layer in contact with the silicon substrate planar surface, wherein the first tungsten disulfide layer includes a planar surface;
   c. n number of graphene layers alternated with (n−1) number of hexagonal boron nitride layers, wherein at least one of the n number of graphene layers is in contact with the first tungsten disulfide layer planar surface, wherein at least one of the n number of graphene layers includes a planar surface, wherein each of the n number of graphene layers includes a distinct thickness; wherein each of the (n−1) number of hexagonal boron nitride layers includes a distinct thickness, and
   d. a second tungsten disulfide ($WS_2$) layer in contact with the at least one of the n number of graphene layers planar surface.
4. An aperiodic graphene multilayer nanostructure according to claim 3, wherein a genetic optimization algorithm is used to determine the number of n number of graphene layers, and the distinct thickness for each of the n number of graphene layers, to ensure that graphene multilayer nanostructure has an absorption efficiency of unity at its peak mid-infrared frequency.
5. A method for fabricating an aperiodic graphene multilayer nanostructure, including forming n number of alternating layers of a first material and second material between a first support material and second support material, wherein the first support material is formed on a substrate material; and optimizing the number and thickness of the first material and the number and thickness of the second material using a genetic optimization algorithm to ensure that the aperiodic graphene multilayer nanostructure has an absorption efficiency of unity at its peak mid-infrared frequency.
6. A method according to claim 5, wherein the first material is graphene, the second material is hexagonal boron nitride (hBN), the first support material is silicon carbide (SiC), the second support material is silicon carbide (SiC), and the substrate material is tungsten (W).

7. A method according to claim 5, wherein the first material is graphene, the second material is hexagonal boron nitride (hBN), the support material is tungsten disulfide ($WS_2$), and the substrate material is silicon (Si).

DESCRIPTION OF THE DRAWING FIGURES

A more detailed understanding of the invention may be had from the following description, given by way of example, in conjunction with the accompanying drawing, wherein like numerals indicate like elements, and wherein.

Figure 3:
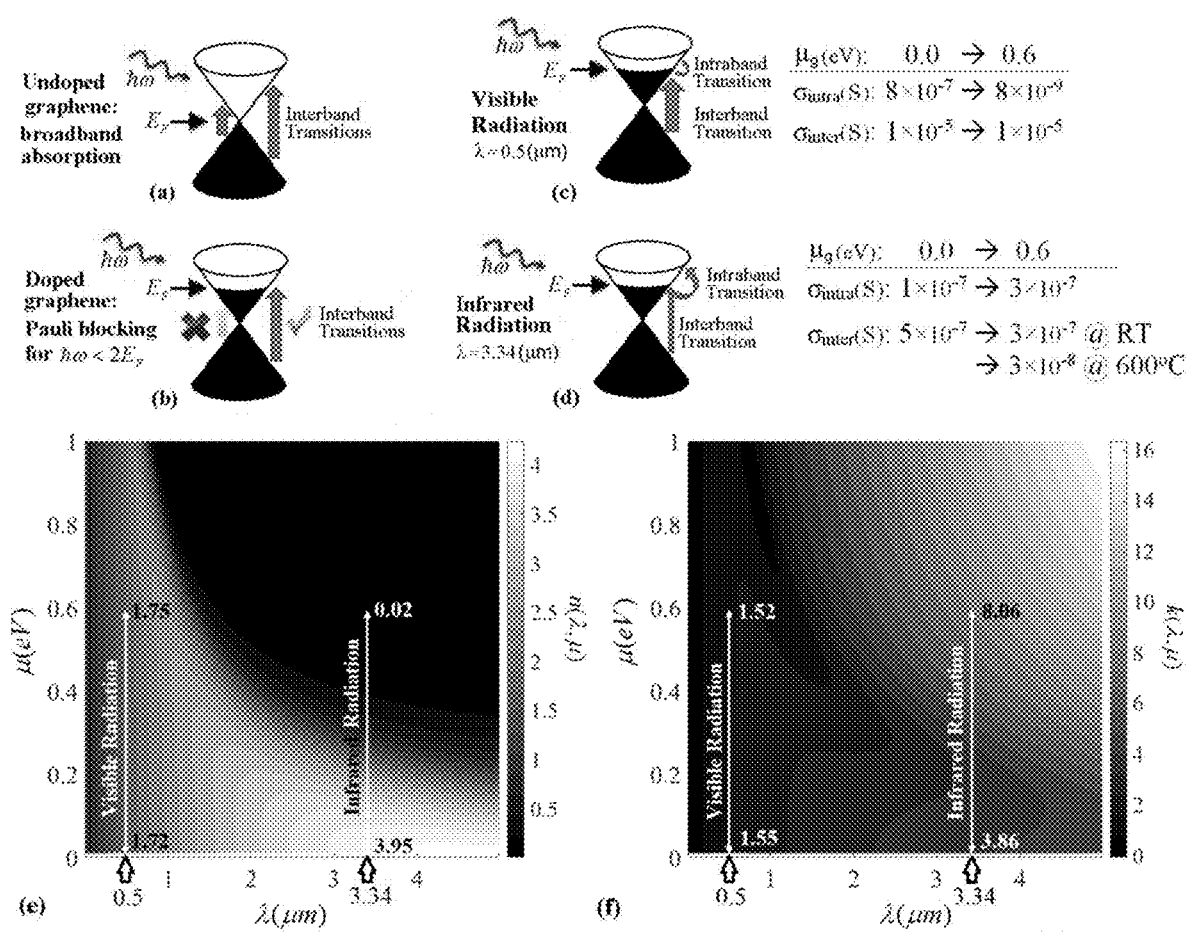
Figure 4:
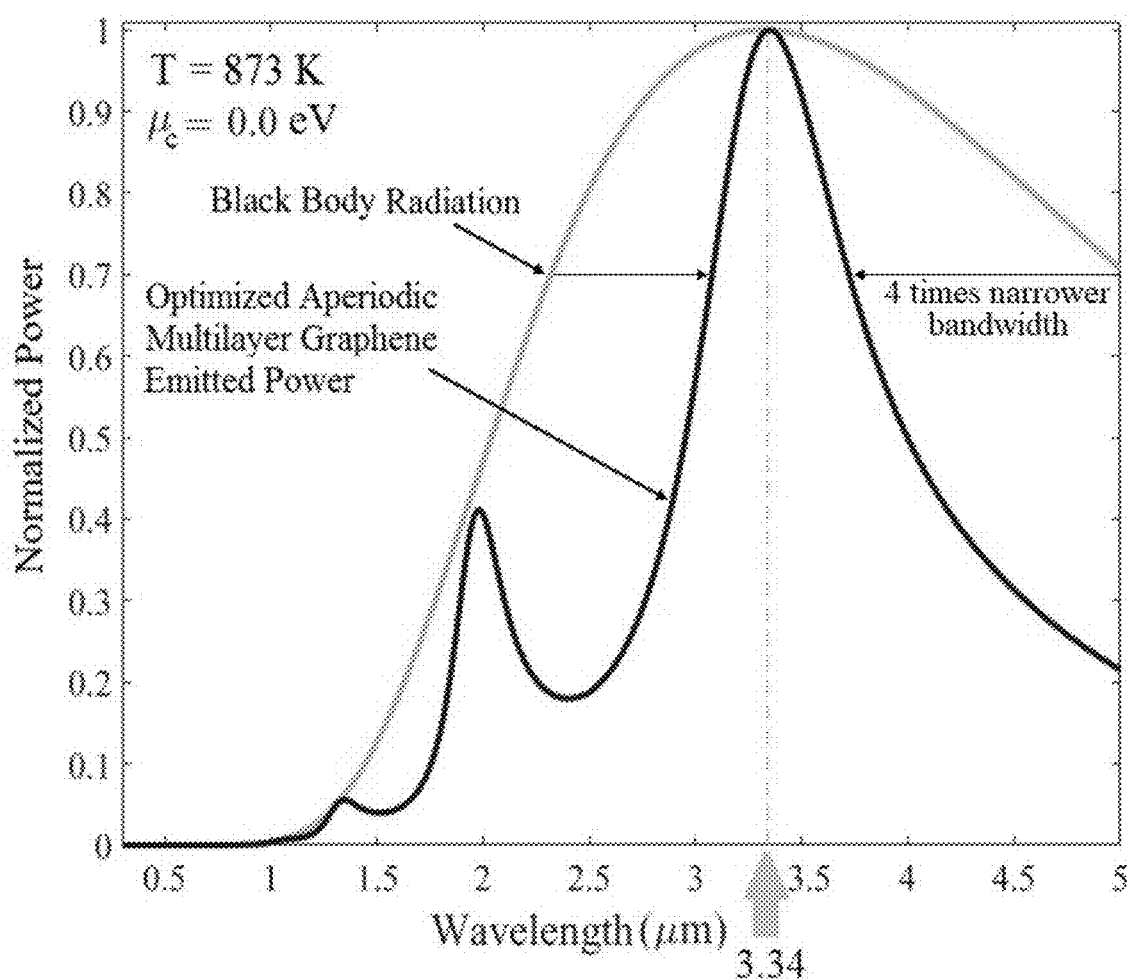
Figure 5:
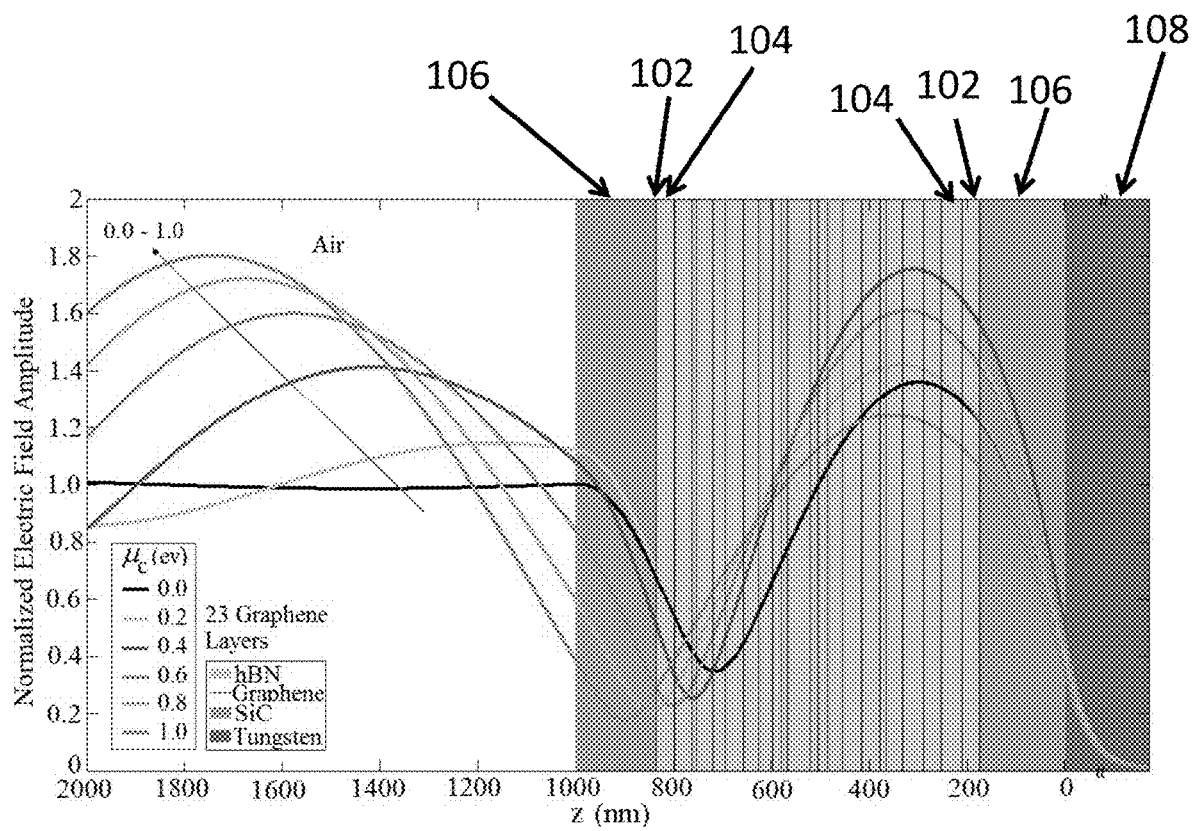
Figure 6A:
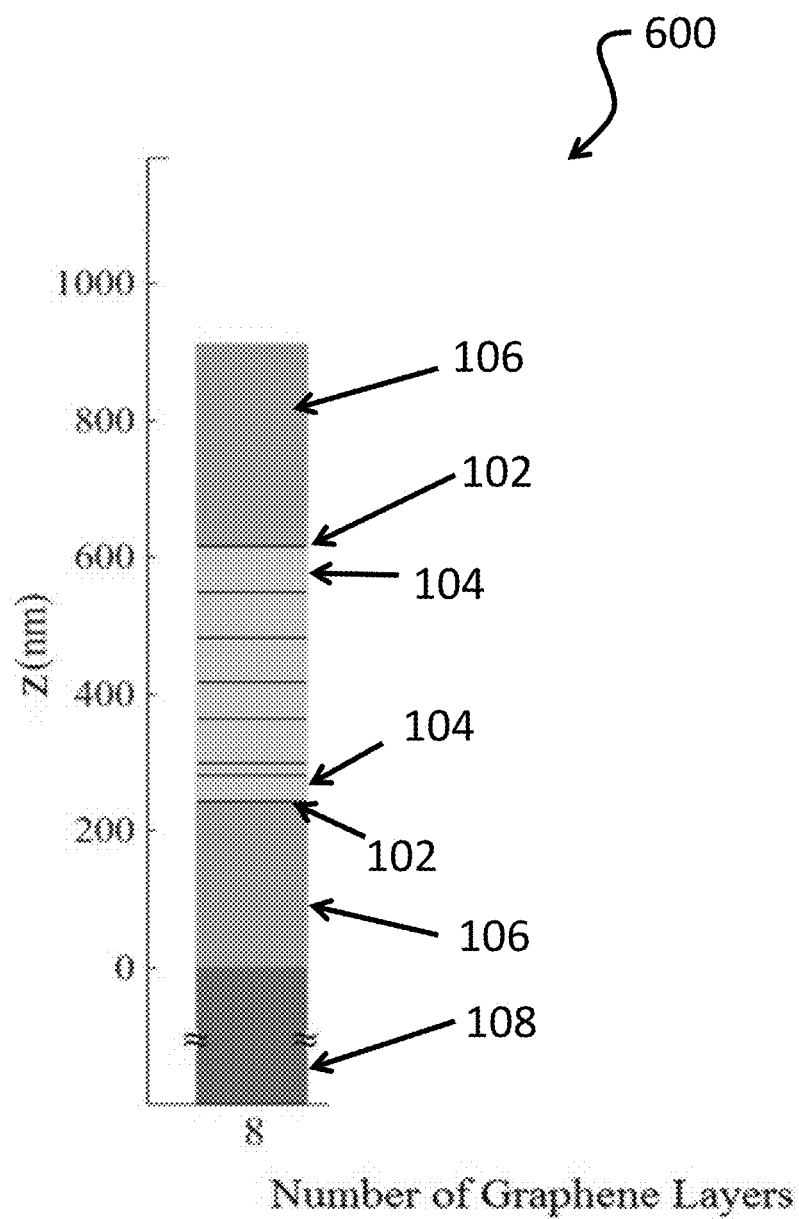
Figure 6B:
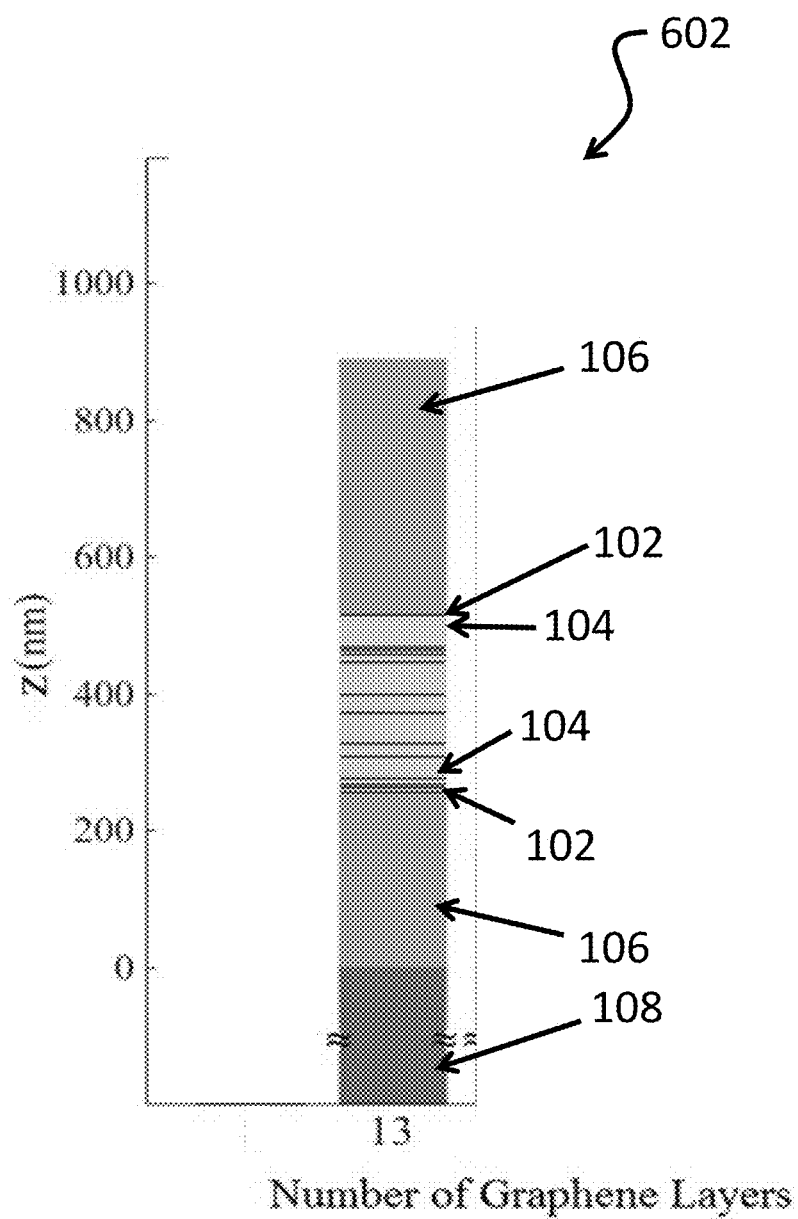
Figure 6C:
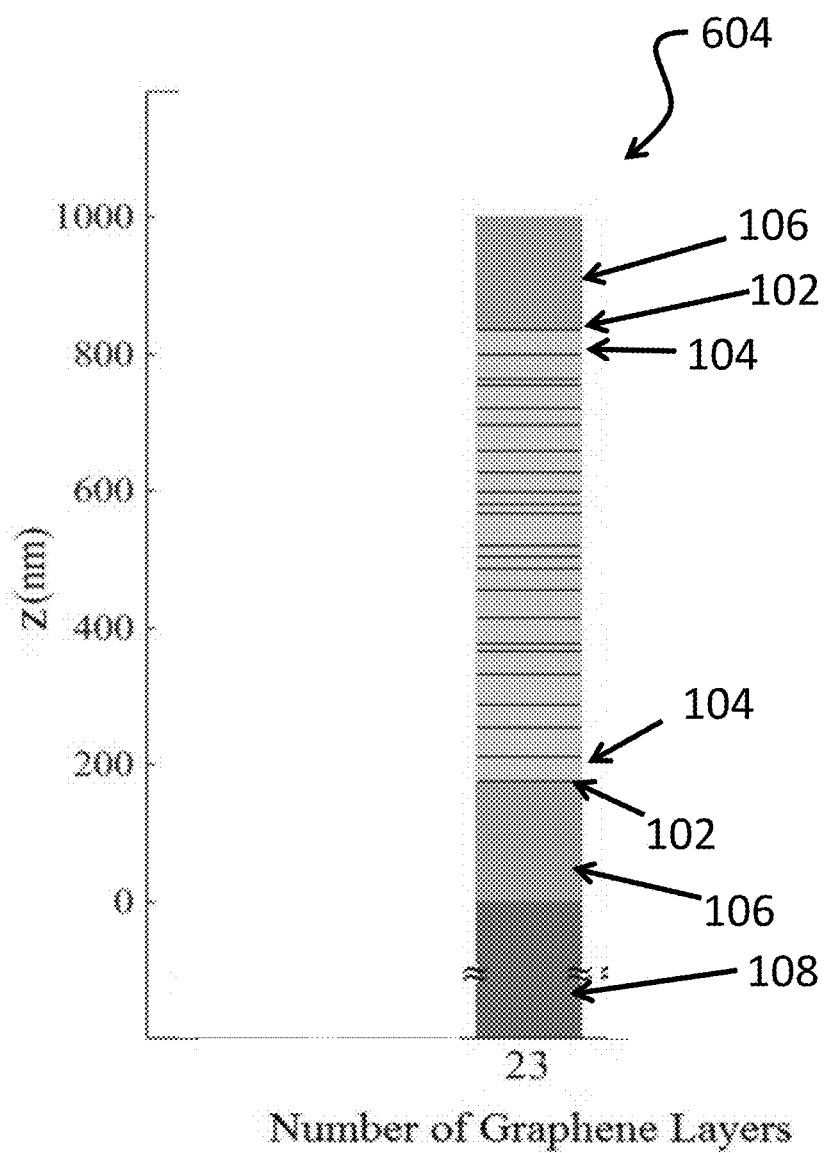
Figure 6D:
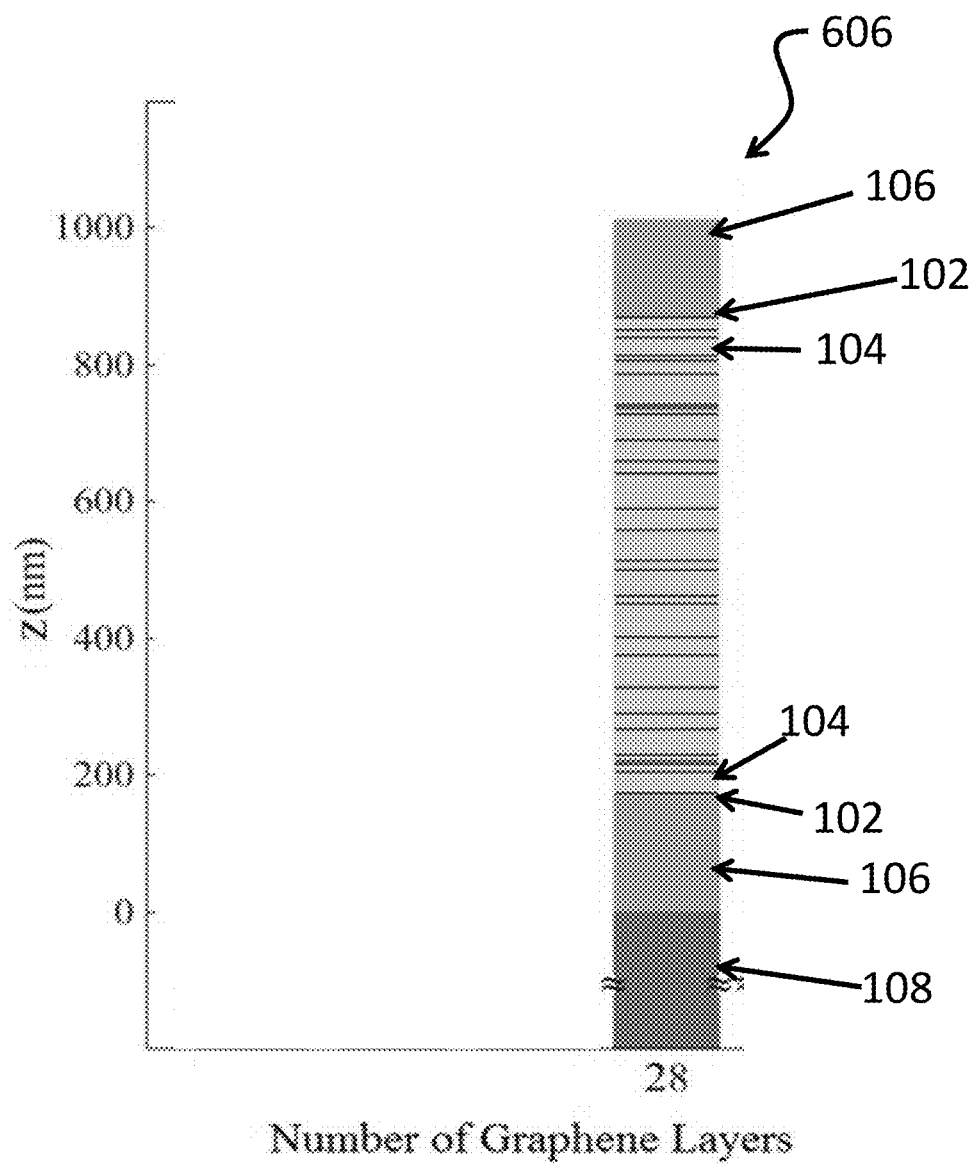
Figure 6E:
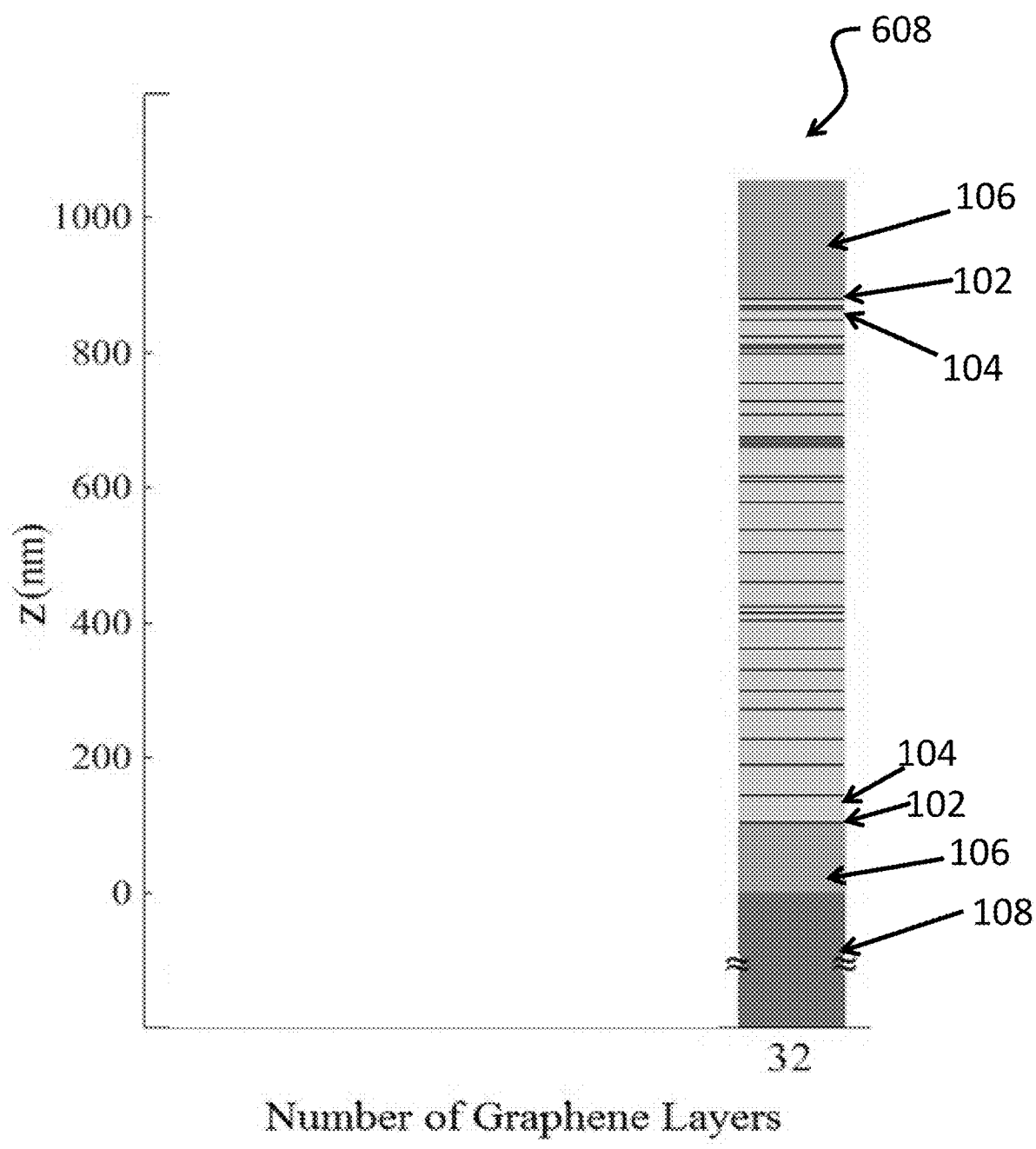
Figure 7:
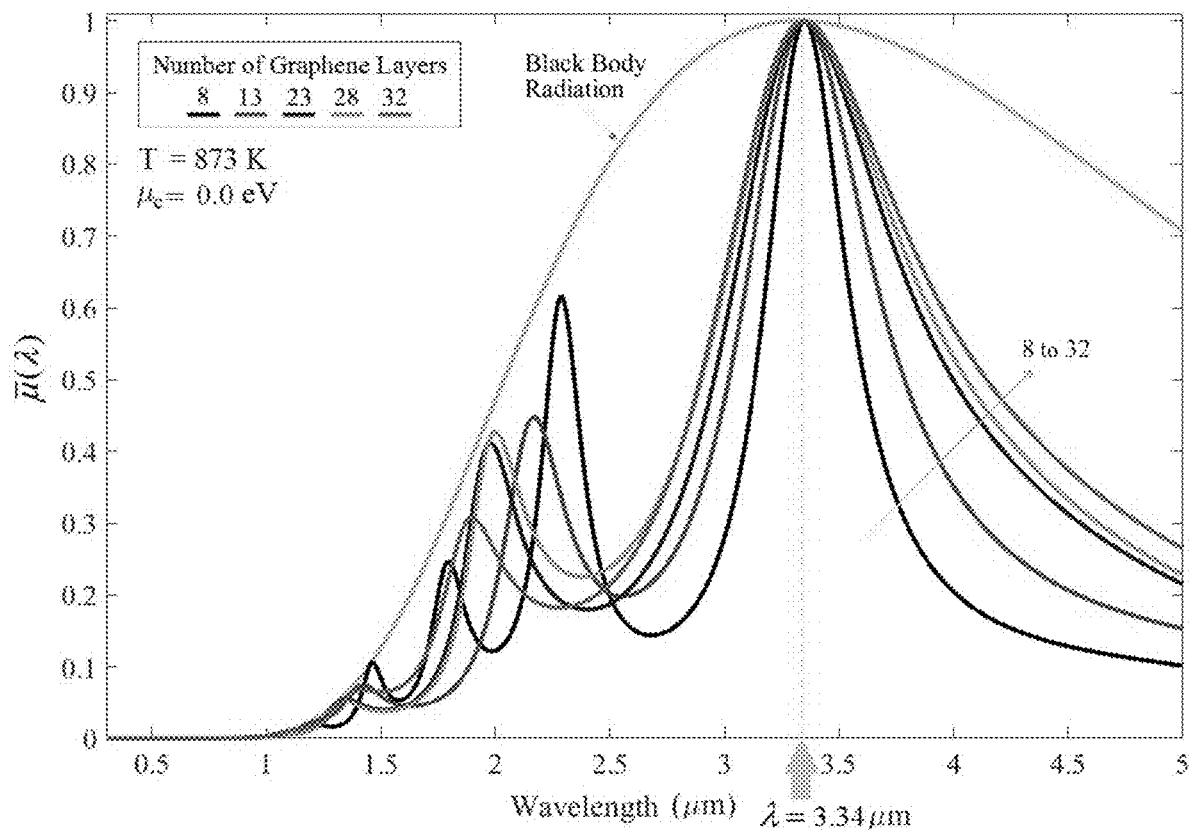
Figure 8:
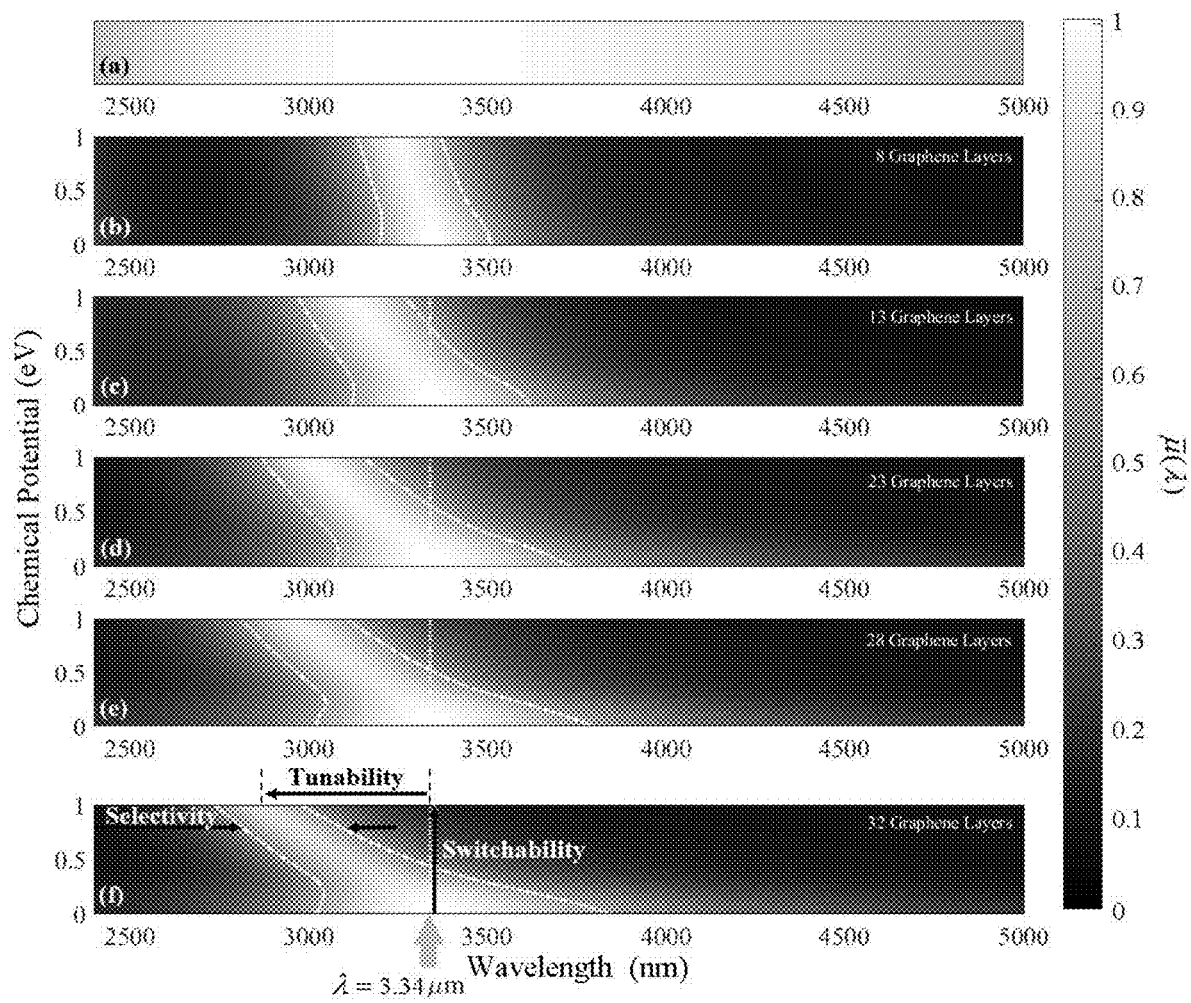
Figure 9:
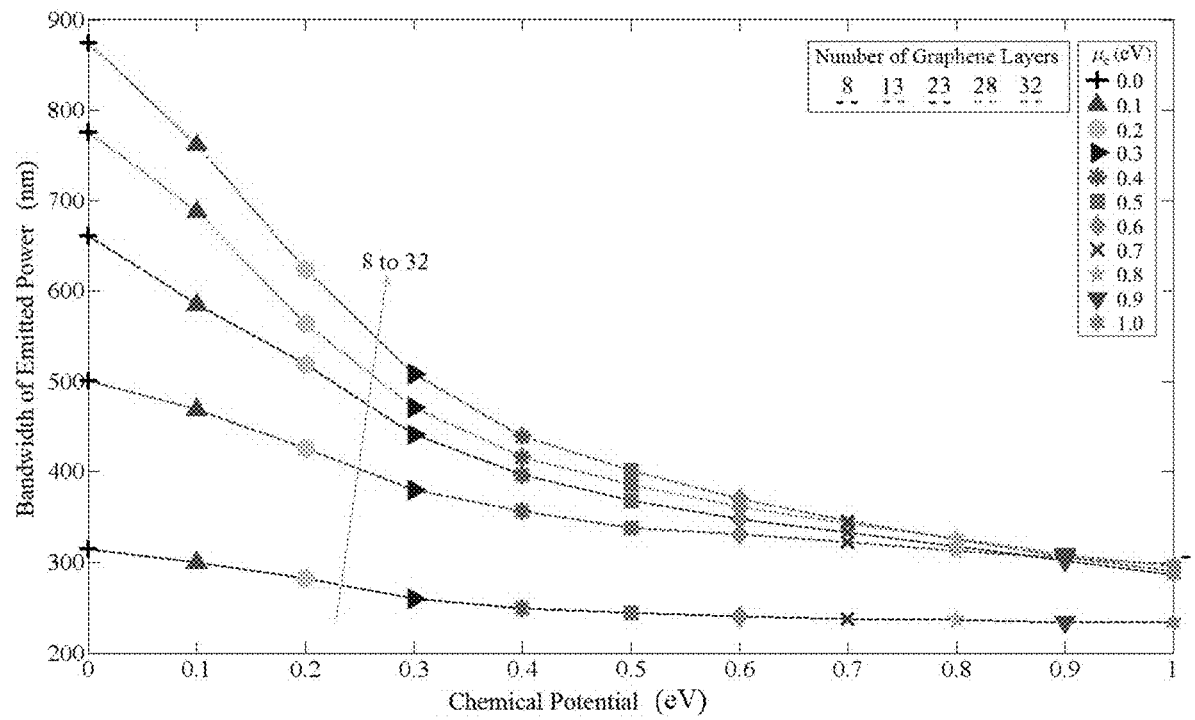
Figure 10:
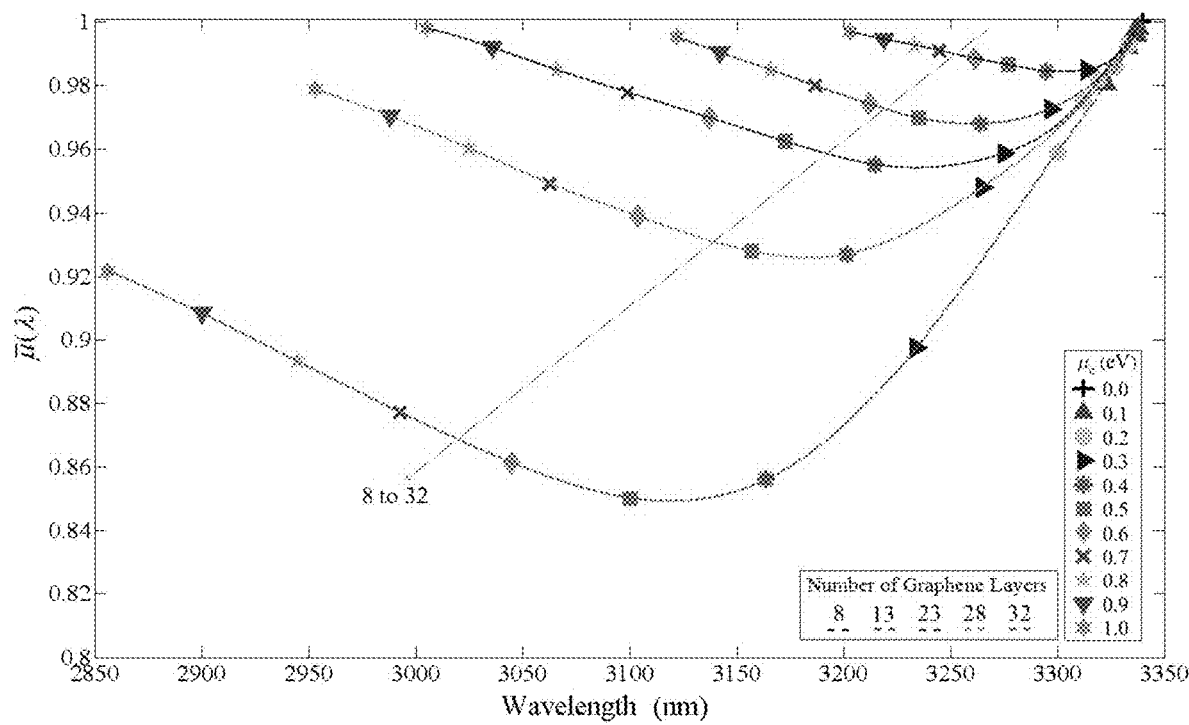
Figure 11:
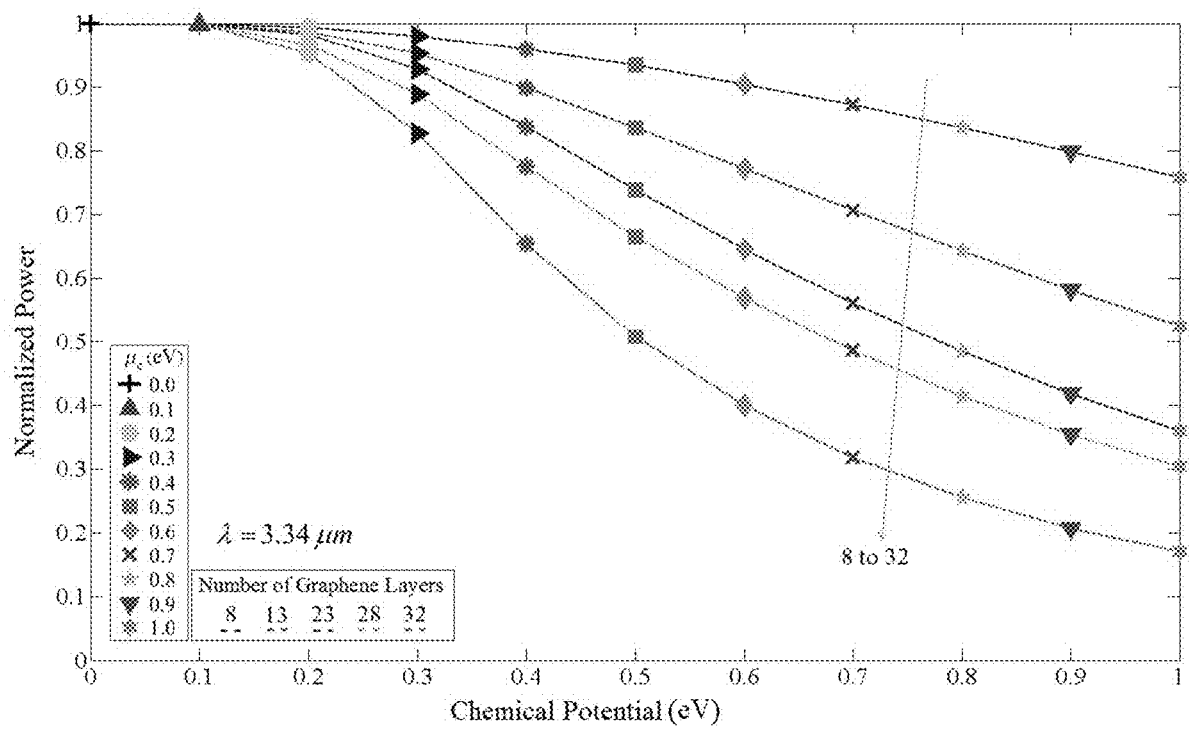
Figure 12:
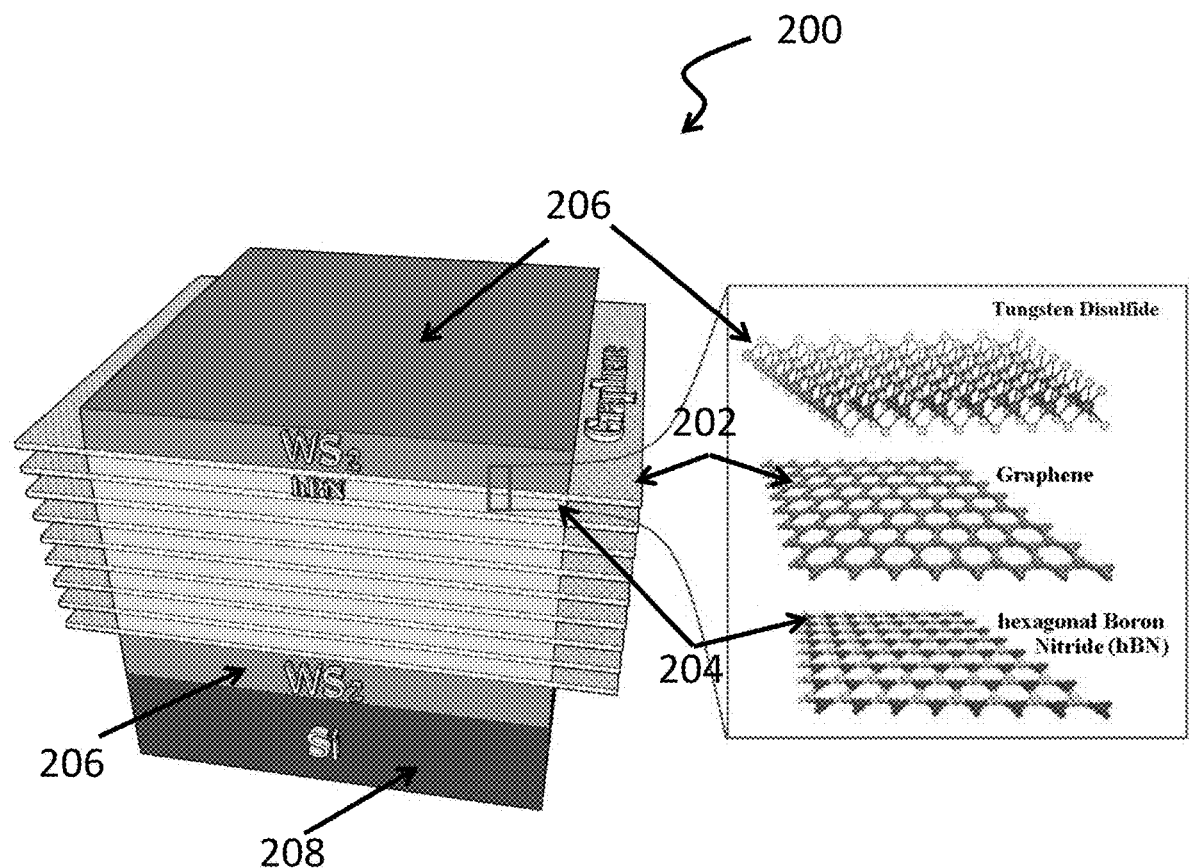
Figure 13:
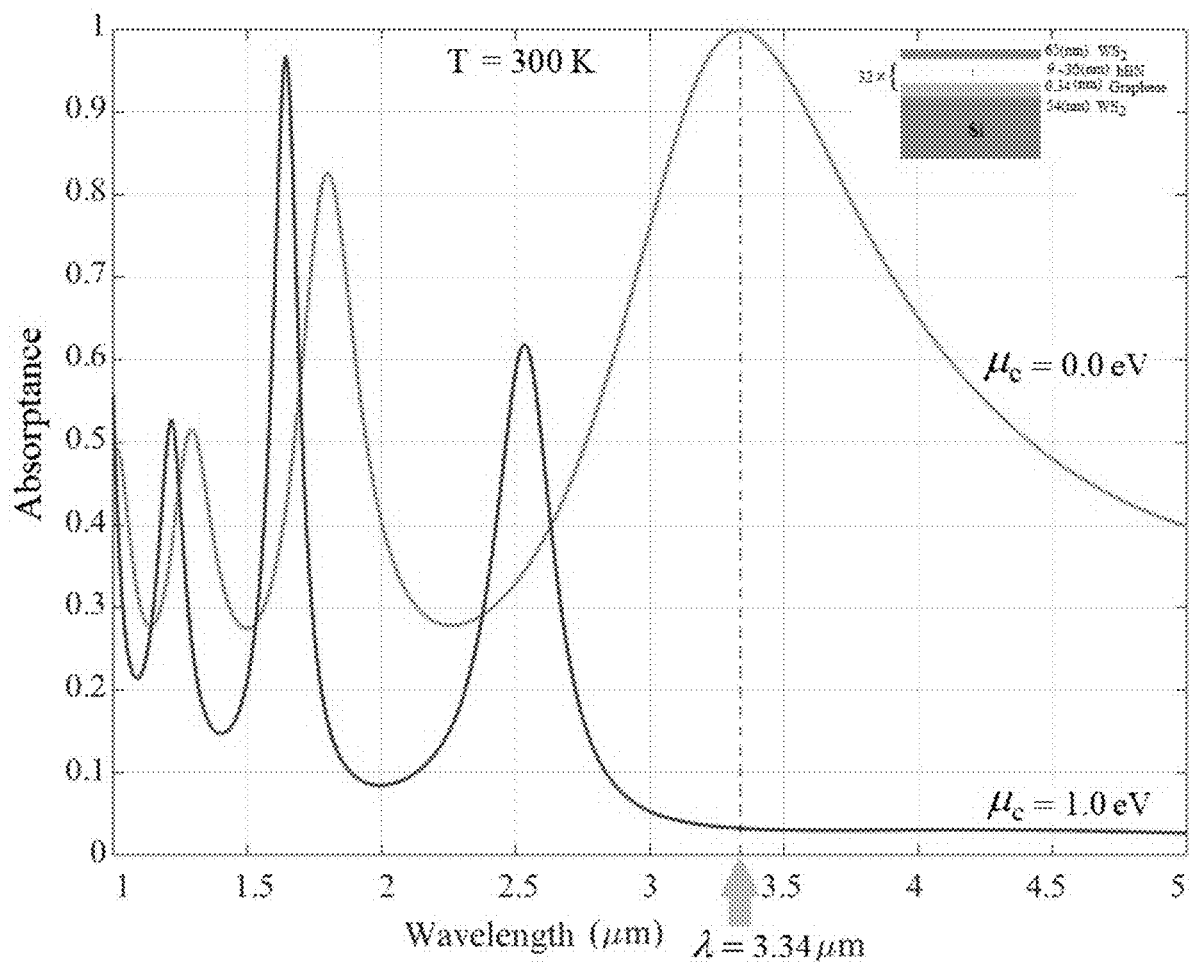

FIG. 3 describes the optical conductivity of a graphene layer and its equivalent refractive index as a function of the chemical potential and the wavelength of incident light, in accordance with the present invention;

FIG. 4 is a graph of the normalized power radiated per unit area and unit wavelength by the graphene multilayer nanostructure in the normal direction according to exemplary embodiments of the present invention;

FIG. 5 is a graph depicting the profile of the electric field amplitude normalized with respect to the field amplitude of the incident plane wave for an optimized graphene multilayer nanostructure according to exemplary embodiments of the present invention;

FIG. 6A depicts side facing cross-sectional views of an optimized aperiodic graphene multilayer nanostructure including 8 graphene layers according to exemplary embodiments of the present invention;

FIG. 6B depict side facing cross-sectional views of an optimized aperiodic graphene multilayer nanostructure including 13 graphene layers according to exemplary embodiments of the present invention;

FIG. 6C depict side facing cross-sectional views of an optimized aperiodic graphene multilayer nanostructure including 23 graphene layers according to exemplary embodiments of the present invention;

FIG. 6D depict side facing cross-sectional views of an optimized aperiodic graphene, multilayer nanostructure including 28 graphene layers according to exemplary embodiments of the present invention;

FIG. 6E depict side facing cross-sectional views of an optimized aperiodic graphene multilayer nanostructure including 32 graphene layers according to exemplary embodiments of the present invention;

FIG. 7 is a graph of Normalized power radiated per unit area and unit wavelength in the normal direction by the structures of FIG. 4 as a function of wavelength;

FIG. 8 depicts the thermal signature of each of graphene multilayer nanostructures shown in FIGS. 5A-5E;

FIG. 9 is a graph depicting the effect of changing the chemical potential of the graphene layer on the bandwidth of the thermal power emitted from various optimized graphene multilayer nanostructure wherein each graphene multilayer nanostructure includes different and distinct numbers of graphene layers, according to exemplary embodiments of the invention;

FIG. 10 is a graph showing the effect of changing the chemical potential on the tunability of the thermal power emitted from the optimized graphene multilayer nanostructures with different and distinct numbers of graphene layers according to the exemplary embodiments of the present invention;

FIG. 11 is a graph of the switchability of the emitted thermal power of multiple optimized graphene multilayer nanostructures according to exemplary embodiments of the present invention, wherein each of the graphene multilayer nanostructures includes a different and distinct number or graphene layers;

FIG. 12 shows another exemplary multilayer heterostructure of graphene multilayer nanostructure constructed with the hybrid optimizing algorithm according to exemplary embodiments of the present invention; and FIG. 13 is an exemplary depiction of the absorptance of an optimized graphene multilayer nanostructure with a thickness of 65 nm for the top of the tungsten, wherein the graphene multilayer nanostructure has 32 hBN layers and 32 graphene layers, including a thickness of 54 nm for the bottom of the tungsten layer.

DETAIL DESCRIPTION OF THE INVENTION

Figure 1:
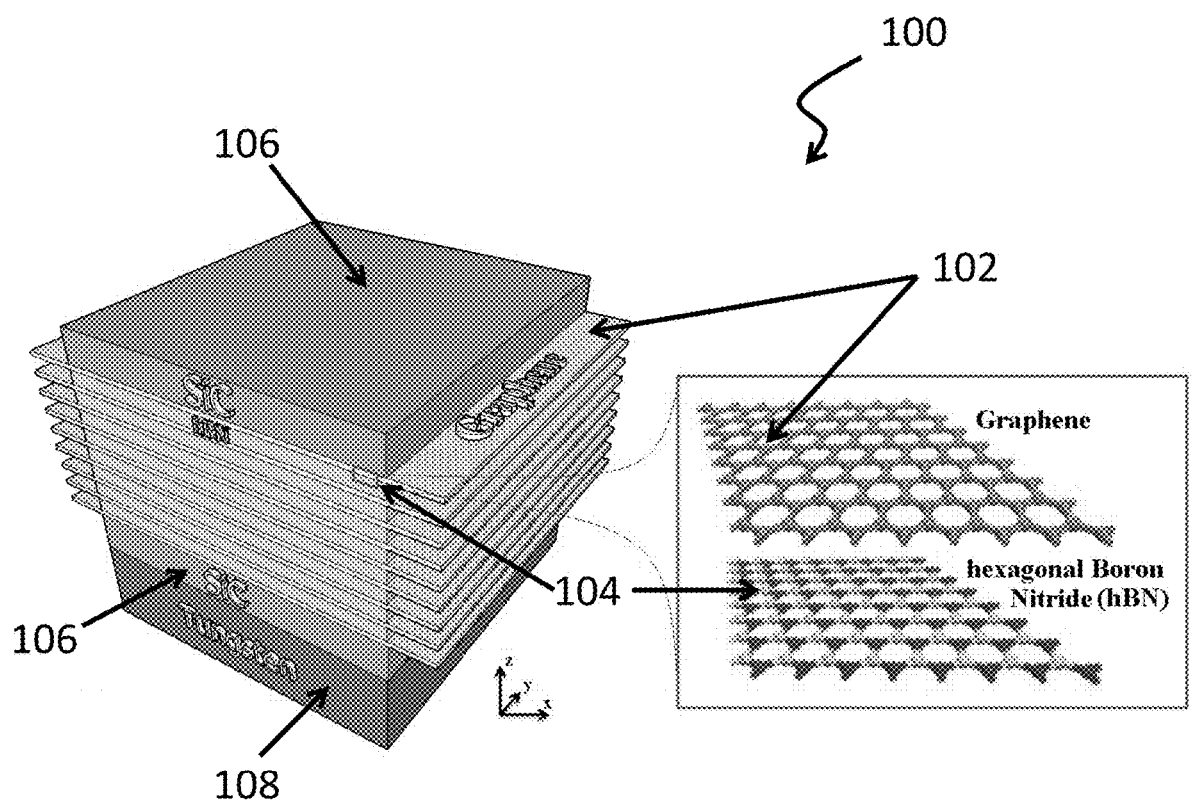
FIG. 1 depicts an exemplary graphene multilayer nanostructure according to exemplary embodiments of the present invention.

FIG. 1 depicts the schematic of an electrically controllable and tunable electromagnetic field absorber/emitter using graphene multilayer nanostructure (e.g., "graphene multilayer nanostructure 100") according to the present invention. The graphene multilayer nanostructure 100 described herein provides spectra-altering properties similar to that of more complex and harder-to-fabricate two- or three-dimensional structures as is described by Fleming et al., in "All-metallic three-dimensional photonic crystals with a large infrared bandgap." Thus, the one-dimensional (1D) structures are particularly interesting as the transmission spectra of 1D photonic crystals can be simulated analytically using transfer matrix methods.

Graphene multilayer nanostructure 100 is composed of alternating layers of lattice structure graphene 102, and lattice structure hexagonal boron nitrate (hBN) layers 104. In one particular embodiment, the layers described herein are sheet layers of material. In another exemplary embodiment, each hBN layer 104 serves as a dielectric between the graphene layers 102. In accordance with an exemplary embodiment of the invention, the hBN layers 104 serve as insulating layers between the multiple graphene layers 102. The alternating layers of graphene layer 102 and hBN layer 104 are sandwiched between two silicon carbide (SiC) layers 106. In still another exemplary embodiment, the entire stack of alternating layers of graphene layer 102 and hBN layer 104 may be formed such that at least one layer of SiC layer 106 is positioned at one end of the stack. In one particular embodiment, a graphene layer 102 is in contact with SiC layer 106, and the hBN layer 104 is in contact with the graphene layer 102, and a second graphene layer 102 is in contact with the hBN layer 104. The present invention uses a semi-infinite tungsten (W) substrate 108 as the substrate in the graphene multilayer nanostructure 100. In one exemplary embodiment, substrate 108 is in contact with silicon SiC layer 106. In still another embodiment, substrate 108 serves as the substrate upon which the graphene layer is deposited.

One skilled in the art will understand that various conventional methods may be used to construct multilayer nanostructures, such as graphene multilayer nanostructures 100 of the present invention. As such, the method for constructing the multilayer nanostructures of the present invention will not be discussed herein, for brevity. In that regard, one skilled in the art will understand that one particular method for constructing 2D nanostructure materials such as graphene and hBN layers described herein can be prepared through mechanical exfoliation and chemical vapor deposition and then transferred onto different substrates at a desired location. Liu et al. provides the detail of recent fabrication methods of multilayer of 2D materials, in "Recent Progress in the Fabrication, Properties, and Devices of Heterostructures Based on 2D Materials."

Each hBN layer 104 has an atomic thickness of 0.33 nm, which is close to the atomic thickness of 0.345 nm for a graphene layer 102. The one-atom-thick hBN layer 104 provides a very small resolution to accurately adjust the spacing between the graphene layers 102 in the aperiodic graphene multilayer nanostructure 100. As single-atom-layer thickness of graphene 102 has low single-pass optical absorption, multiple graphene monolayers are used and the thickness of (~number of) hBN layers between them is found using an optimization algorithm to find the optimal aperiodic structures that maximize the absorption coefficient to unity. In one particular embodiment, the result of the algorithm is the thickness of the hBN layer 104. The number of the hBN layers 104 may be determined by dividing these thicknesses by the thickness of an hBN monolayer (~0.33 nm). In another exemplary embodiment, the algorithm is used to determine the optimal locations for graphene layers 102 in graphene multilayer nanostructure 100 is determined to achieve maximum absorption on each graphene layer to ensure the highest possible absorption As such, the graphene multilayer nanostructure 100 of the present invention includes a predetermined thickness of hBN layers necessary for unity absorptance. The present invention uses a hybrid optimization method, disclosed herein, to determine the proper thickness of the SiC layer 106 and the thickness of hBN layers 104 necessary to achieve a graphene multilayer nanostructure 100 with perfect absorptance equal to unity, as discussed below.

The density of charge carriers associated with the chemical potential in graphene layers 102 can be controlled by applying a DC bias field perpendicular to the graphene/hBN surfaces 104. For example, graphene layers 102 have no energy gap between the conduction and valence bands, and thus the number of charge carriers can be continuously changed by the electric field effect generated by the DC bias voltage, adding either electrons or holes to the system. As such, by varying the DC bias voltage, one may tune the energy gap of electron transition to valence band to particular frequencies of photons and thereby varying the optical conductivity of the graphene layers 102. The absorption is proportional to the real part of the optical conductivity as described by Stauber et al. in "Optical conductivity of graphene in the visible region of the spectrum."

The absorptance of the graphene multilayer nanostructure 100 may be calculated. For example, since we take the W substrate 108 to be semi-infinite, the transmittance of W substrate 108 may be considered to be zero, so that $A_{TE/TM}(\lambda)=1-R_{TE/TM}(\lambda)$, where $A_{TE/TM}(\lambda)$ is the TE/TM absorptance, $R_{TE/TM}(\lambda)$ is the TE/TM reflectance, and $\lambda$ is the wavelength of the light incident on the graphene multilayer nanostructure 100. Please note that although the present invention is being described with respect to an absorber, one skilled in the art will understand that the invention could be described in terms of an emitter, because of Kirchhoff's second law and conservation of energy under thermal equilibrium.

It is well known that the response of optical conductivity of graphene to an external electric field can be derived by non-interacting linear response theory so that electrons are considered to move due to the applied electric field that is the sum of the external field and the self-consistent field induced by all the electrons. Thus, to calculate the optical conductivity of graphene layer 102 and consequently the refractive index of graphene layer 102, the Kubo formula is used to divide the optical conductivity of graphene layer 102 into the intraband and interband parts, which correspond to free carrier absorption and transition from the valance band to the conduction band, respectively. The intraband and interband transitions are calculated analytically using the expressions $$\sigma_{d,intra} = i\frac{e^2 K_B T}{\pi\hbar^2(\omega+2i\Gamma)}\left[\frac{\mu_c}{K_B T} + 2\ln\left(e^{-\frac{\mu_c}{k_B T}}+1\right)\right] \text{ and } \sigma_{d,inter} \approx$$

$$\frac{ie^2}{4\pi\hbar}\ln\left(\frac{2|\mu_c|-(\omega+2i\Gamma)\hbar}{2|\mu_c|+(\omega+2i\Gamma)\hbar}\right),$$

respectively, where $\omega$ is the radian frequency, $\mu_c$ is the chemical potential of the graphene sheet, $\Gamma$ is the charged particle scattering rate, T is the temperature, $\hbar$ is reduced plank constants, e is electron charge, and $K_B$ is Boltzmann constant.

The contributions of intraband and interband transitions in the optical conductivity significantly depend on the carrier density, so that each part has different strength at different frequency ranges. These contributions are also directly related to the chemical potential in graphene layer 102. FIG. 3 describes the optical conductivity of graphene layer 102 and its equivalent refractive index as a function of the chemical potential and the wavelength of incident light. It can be seen in FIG. 3(a) that, for undoped suspended graphene (i.e., there is no electric field to tune the chemical potential), the interband transitions are responsible for the ~2.3% broadband absorption. The DC electric field bias tunes the chemical potential in graphene layer 102, adding either electrons or holes to the system. In this scenario, the interband transitions of electrons only occur for $2E_0=\hbar\omega>2E_F$, while other transitions are forbidden or blocked for $E_0<2E_F$, as shown in FIG. 3(b). The absorption due to the interband transition is reduced by Pauli blocking because the vacant states in the conduction band are all occupied when the pumping light is intense enough for a specific relaxation process. The intraband transitions are mainly responsible for the absorption in the far-infrared and also contribute, to some extent, to the mid-infrared optical response, as shown in FIGS. 3(c) and 3(d). For short wavelengths in the visible range, optical conductivity of graphene layer 102 is dominated by interband transitions. The contribution of intraband transition decreases by increasing the chemical potential in the visible range and has, therefore, no significant effect on the optical conductivity of graphene layers 102 at these wavelengths.

Figure 2:
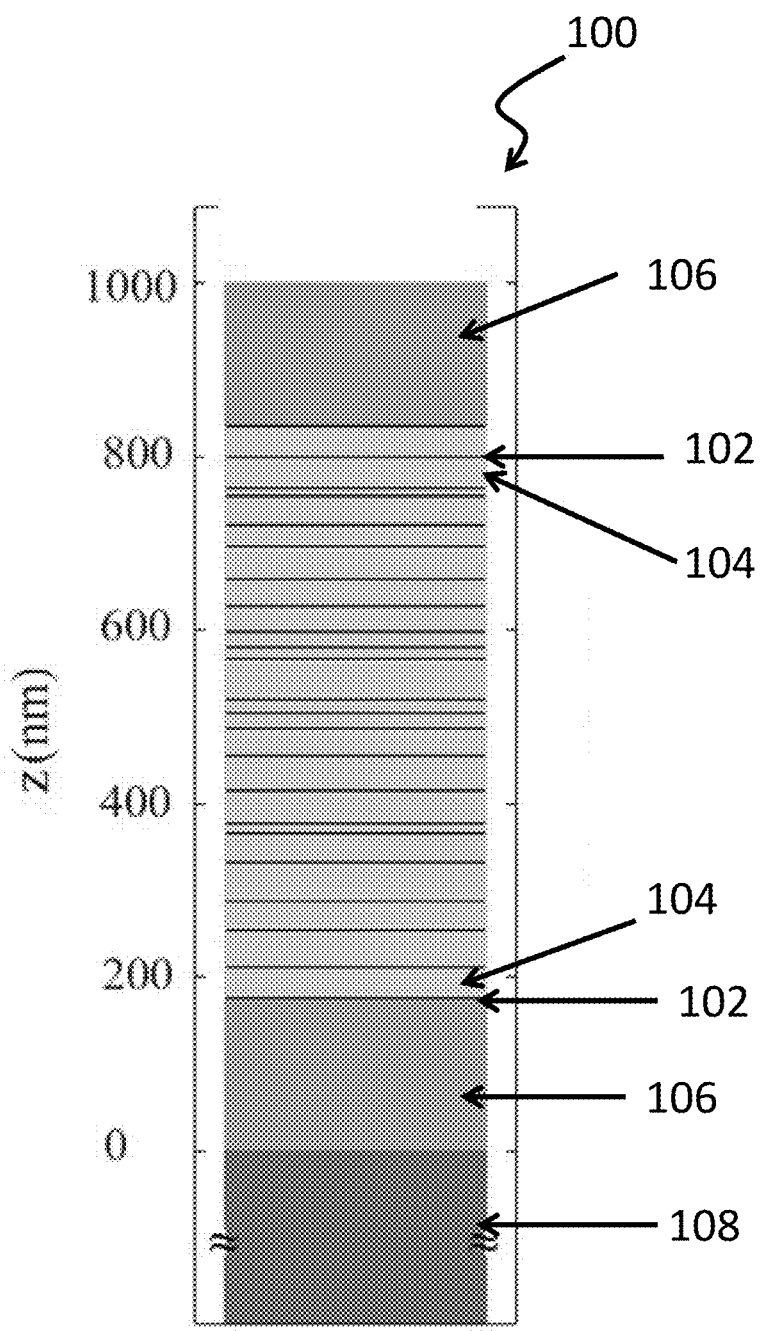
FIG. 2 depicts a side facing cross-sectional view of an optimized aperiodic graphene multilayer nanostructure according to exemplary embodiments of the present invention.

Finally, the dielectric permittivity of monolayer graphene layer 102, $\varepsilon_G$, at optical frequencies, can be calculated by $\varepsilon_G=i\sigma_d/\omega\varepsilon_0 t_G$, where $\sigma_d$ is the conductivity of graphene layer 102, $t_G$, is the thickness of a single graphene layer, $\omega$ is the angular frequency, and $\varepsilon_0$ is the free-space electric permittivity. FIGS. 2(e) and 2 (f) show the real and imaginary parts of the refractive index of graphene layer 102 as a function of the chemical potential in graphene layer 102. It can be observed that in the visible range, the real and imaginary parts of the refractive index of graphene layer 102 are nearly independent of the chemical potential. However, for longer wavelengths in the infrared range, the interband transition is increasing as the wavelength becomes longer, while the interband transition contribution significantly decreases behaving as a step-like function with threshold $2|E_F|$, such that the small transition when the photon energy is below $2|E_F|$, and large transition when the photon energy is above $2|E_F|$. Note that $E_F$ is the Fermi level that basically corresponds to the same physical quantity as the chemical potential, $\mu_c$, in material science so that the Fermi level is the total chemical potential for electrons in the system. As both terms have been frequently used in the literature, these two terms are used interchangeably. As such, the intraband transition contribution becomes comparable with the interband transition contribution, as shown in FIG. 2 (d).

The control over intraband transitions can be obtained by tuning the chemical potential in graphene layers 102, resulting in graphene applications in the infrared and THz ranges. For infrared radiation at the high ambient temperature of the thermal emitter (e.g., 873 K), the results show an order of magnitude decrease in the contribution of interband transitions, leading to larger contribution of intraband transitions to the total optical conductivity of graphene layer 102. As such, the refractive index of graphene layer 102's can be highly controlled by tuning of its chemical potential in the infrared wavelength ($\lambda$=3340 nm) and high temperature (T=873K). Although the control of the refractive index of graphene layer 102 increases by increasing frequencies from infrared to THz, the intensity of thermal radiations is weak at THz frequencies. As such, the aperiodic graphene multilayer nanostructure 100 of the present invention is designed to operate at mid-infrared frequencies to have both considerable thermal emission and control on the refractive index of graphene layer 102.

For the hBN layer 104, the SiC 106 and the W layer 108, the wavelength-dependent indices of refraction (both real and imaginary parts) are obtained from experimental data. The use of real experimental data in the calculation is important as it includes the effect of typical imperfections in material synthesis and fabrication. The experimental data used herein has the temperature dependence of the refractive index to consider any change in material refractive index at high-temperature operation of graphene multilayer nanostructure 100. For instance, the real and imaginary parts of the refractive index of tungsten layer 108 are decreased by increasing the ambient temperature at mid-infrared frequencies.

Moreover, it is will be well understood that the effect of variations in the thickness of the hBN layer 104, the SiC 106 and the W layer 108 can be neglected due to thermal expansion on the emittance/absorptance of graphene multilayer nanostructure 100.

It should also be noted that each of the materials used to construct the graphene multilayer nanostructure 100 have melting points that can tolerate temperatures above those generated during the absorbing (or emitting) experienced by the graphene multilayer nanostructure 100 (i.e., whether used as an absorber or thermal emitter) 100. For example, hBN layer 104 sublimes at 2973° C., the SiC layer 106 melts at 2730° C., and the graphene layer 102 melts at 4150° K. As such, all materials used in graphene multilayer nanostructure 100 can tolerate high temperatures due to their high melting points.

As noted, the hybrid optimization method mentioned above may be used to find the optimum thicknesses of the SiC layers 102 and the optimum thickness of hBN layers 104 in graphene multilayer nanostructure 100 to ensure that the absorbance of graphene multilayer nanostructure 100 is equal to the emittance. The hybrid optimization method used herein consists of a microgenetic global optimization algorithm coupled to a local optimization algorithm. It is well known that the local optimization algorithms find the local minima or maxima of a given set. It is also well known that the microgenetic algorithm avoids premature convergence and shows faster convergence to the near-optimal region compared with the conventional large population genetic algorithm, especially in multidimensional problems. Also, it is further well known that global optimization operations attempt to find the global minima or maxima of a given set. As such, it is well understood by those skilled in the art that the hybrid genetic optimization method as used herein, which uses a microgenetic global optimization algorithm coupled to a local optimization algorithm, may be used to calculate the optimized thicknesses of the graphene layer 102 and the optimized thickness of hBN layer 104 for maximizing the absorption to the perfect value of unity at a prespecified wavelength and zero bias condition ($\mu$=0 eV). The operation of a hybrid optimization method such as the one disclosed herein is well known and will not be discussed in detail herein for the sake of brevity. Exemplary thickness of the graphene layers 102, hBN layers 104, SiC layers 106, and W layers 108 in an optimized graphene multilayer nanostructure 100 is discussed more fully below with respect to FIGS. 5A-5E and Table 1.

It is understood by those skilled in the art that a microgenetic algorithm is an iterative optimization procedure which starts with a randomly selected population of potential solutions and gradually evolves toward improved solutions by applying the genetic operators which are patterned after the natural selection process. As used herein, the microgenetic algorithm being with a population of thickness values for the SiC layers 106 and a population of the possible thickness of hBN layers 104, which is created by a random selection. For the fixed number of graphene layer 102, the possible thicknesses of hBN layers 104 are evaluated according to the hybrid optimization method disclosed herein. In one particular embodiment, the absorption of the graphene multilayer nanostructure 100 with a desired thickness is calculated to evaluate the level of optimization necessary to determine the optimal thickness of each of the graphene layers 102, hBN layers 104, SiC layers 106, and W layer 108 therein. In one particular embodiment, the thickness of each of the layers is calculated simultaneously. Then the hybrid optimization algorithm proceeds to iteratively generate a new population of thickness values by using the crossover, mutation, and selection operators to find the optimum location of the graphene layers 102 in the graphene multilayer nanostructure 100. For instance, the optimized thickness of the smallest hBN area in an optimized structure with 23 layers of graphene is found to be d=8.9 nm which corresponds to 27 hBN monolayers. To check the significance of our optimization algorithm, the calculated thickness is changed to 5×d, 10×d, and 20×d, while the thicknesses of other layers are constant. This study can also indicate the sensitivity of the optimized structure to fabrication process variations. At the optimized wavelength $\lambda$=3.34 µm, the tungsten layer 108 and graphene layers 102 contribute ~46% and ~52%, respectively, to the total absorption of the optimized graphene multilayer nanostructure 100. However, the increase in the thickness of only one hBN layer 104 leads to increase in the undesired reflectance so that, for the altered the hBN layer 104 thickness of 20×d, the contributions of the W layer 108 and graphene layers 102 to the total absorption are dramatically decreased to ~20% and ~25%, respectively. By increasing the thickness of the narrowest hBN layer 104 from the value that is obtained from the optimization process, the peak of maximum absorption shifts to longer wavelengths and also decreases. As such, the microgenetic algorithm used herein, optimizes the aperiodic graphene multilayer nanostructure 100 is used to produce narrowband infrared thermal emission. Furthermore, is also crucial to maximize the absorption portion of graphene layers by optimizing the structure because this provides stronger control over the structure to decrease or increase the total absorption of aperiodic graphene multilayer nanostructure 100.

In accordance with the invention, the thermal emission of the graphene multilayer nanostructure 100 is evaluated at the ambient temperature of 873 K corresponding to the maximum emission of blackbody at infrared range with the peak at $\lambda$=3340 nm. This is the wavelength at which the microgenetic algorithm is applied to find the optimized layer thickness of the graphene layers 102 and the thickness of hBN layers 104 for the graphene multilayer nanostructure 100 necessary to obtain maximum absorptance. As noted, the chemical potential of the graphene multilayer nanostructure 100 may be controlled by the electric field induced by a DC bias. When the chemical potential of graphene layers 102 are set equal to zero ($\mu_c$=0.0 eV) corresponding to zero DC bias, the maximum absorption on graphene layers can be achieved by seeking the optimum nanostructure.

FIG. 2 shows a side facing a cross-sectional view of the aperiodic graphene multilayer nanostructure 100, according to the present invention. In the exemplary embodiment shown, graphene multilayer nanostructure 100 has been optimized with 23 graphene layers 102 and 22 hBN layers 104. Utilizing the genetic optimization algorithm, according to the invention, the thickness of hBN layers 104 and SiC layers 106 are selected independently so that the structure is entirely aperiodic.

Finally, different approaches are possible to calculate the absorptance, which is equal to the emittance, of the graphene multilayer nanostructure 100. One exemplary method that may be used to calculate the field distribution in aperiodic graphene multilayer structure 100 is to use the transfer matrix method. As such, the optimal thicknesses of layers included in graphene multilayer nanostructure 100 obtained from the genetic algorithm and the refractive indices of the layers at the optimized wavelength are used in transfer matrix equations, leading to information about the transmission and reflection properties of the graphene multilayer nanostructure 100. By calculating the reflection and transmission, the absorptance, A, of the structure can be obtained as $A=1-|t|^2-|r|^2$, where r and t are the reflection and transmission coefficients of the multilayer structure.

FIG. 4 shows $\bar{\mu}(\lambda)$ (e.g., the Normalized Power) as a function of wavelength for the optimized graphene multilayer nanostructure 100 in FIG. 2, wherein the graphene multilayer nanostructure 100 has been excited by a normally incident wave. As can be seen, the optimized graphene multilayer nanostructure 100 according to the present invention exhibits perfect emittance/absorbtance at $\lambda$=3.34 µm. This narrowband perfect emittance is accomplished through the constructive and destructive interference of thermal incidences due to the optimal positions of graphene/hBN layers in the graphene multilayer nanostructure 100 [$\bar{\mu}(\lambda)$], of 2.7 µm at T=873° K reduces to 0.63 µm, showing more than four times narrower bandwidth compared to the black-body radiation curve. As can be seen, the optimized graphene multilayer nanostructure 100 even without DC bias ($\mu_c$=0.0 eV) enables narrowband infrared emittance and thus the selectivity of the thermal power. While the black-body thermal radiation from tungsten has broadband radiation spectra $\Delta\lambda$=2.7 µm, that varies only by its temperature, the graphene multilayer nanostructure 100 placed over the tungsten creates the power spectrum with the narrow bandwidth, $\Delta\lambda$=0.67 µm, and thus enables selective wavelength.

FIG. 5 is a graph depicting the profile of the electric field amplitude normalized with respect to the field amplitude of the incident plane wave for the optimized graphene multilayer nanostructure 100 in FIG. 2. In the example shown, graphene multilayer nanostructure 100 includes multiple graphene layers 102 that is excited by a normally incident plane wave at $\lambda$=3340 nm, wherein the $\lambda$=3340 nm wavelength is the wavelength at which the graphene multilayer nanostructure 100 of FIG. 4 has been optimized. FIG. 5 also shows the effect on the electric field profiles of varying the chemical potential of the graphene layers 102. For example, as can be seen for $\mu_c$=0.0 eV, at which the graphene multilayer nanostructure 100 is optimized to achieve maximum absorptance, the electric field amplitude is almost flat in the air. Consequently, the reflectance of the graphene multilayer nanostructure 100 is almost zero, and the absorptance is therefore almost unity.

It should be noted that the graphene multilayer nanostructure will exhibit perfect emittance at $\lambda$=3.34 µm. FIGS. 6A-6E depicts distinct exemplary optimized graphene multilayer nanostructures 600, 602, 604, 606, and 608, respectively, wherein each of the graphene multilayer nanostructures 600, 602, 604, 606, and 608 are constructed using similar methods as is discussed with respect to graphene multilayer nanostructure 100. Each of graphene multilayer nanostructures 602, 604, 606, and 608 includes different and distinct number of graphene layers 102 one from the other. As shown, FIG. 6A depicts graphene multilayer nanostructure 600 including 8 graphene layers 102; FIG. 6B depicts graphene multilayer nanostructure 602 including 13 graphene layers 102; FIG. 6C depicts graphene multilayer nanostructure 604 including 23 graphene layers 102; FIG. 6D depicts graphene multilayer nanostructure 606 including 28 graphene layers 102; and FIG. 6E depicts graphene multilayer nanostructure 608 including 32 graphene layers 102. For the sake of comparison, each of the graphene multilayer nanostructures 600, 602, 604, 606, and 608 are compared with each nanostructure having a thickness of approximately 1 µm.

FIG. 7 shows the normalized power radiated per unit area and unit wavelength by each of the graphene multilayer nanostructure 600 (including 8 graphene layers), graphene multilayer nanostructure 602 (including 13 graphene layers), graphene multilayer nanostructure 604 (including 23 graphene layers), graphene multilayer nanostructure 606 (including 28 graphene layers), and 608 (including 32 graphene layers), wherein each of the nanostructures is excited in the normal direction as a function of wavelength. With continued reference to FIG. 7, what is observed is that all five structures exhibit perfect emittance at $\lambda$=3.34 µm, which corresponds to the maximum thermal emission of a black-body at T=873 K. Table 1 below depicts exemplary thickness for the graphene layers 102, hBN layers 104, the SiC layers 106, and W layers 108, of optimized graphene multilayer nanostructures 600, 602, 604, 606 and 608 in accordance with the present invention.

TABLE 1

| Graphene multilayer nanostructure 600 layer thickness | Graphene multilayer nanostructure 602 layer thickness | Graphene multilayer nanostructure 600 layer thickness | Graphene multilayer nanostructure 600 layer thickness | Graphene multilayer nanostructure 600 layer thickness |
|---|---|---|---|---|
| SiC (284.9 nm) | SiC (372.9 nm) | SiC (164.6 nm) | SiC (142.1 nm) | SiC (174.6 nm) |
| Graphene | Graphene | Graphene | Graphene | Graphene |
| hBN (65.6 nm) | hBN (45.9 nm) | hBN (35.64 nm) | hBN (18.48 nm) | hBN (11.22 nm) |
| Graphene | Graphene | Graphene | Graphene | Graphene |
| hBN (66.3 nm) | hBN (5 nm) | hBN (35.64 nm) | hBN (10.56 nm) | hBN (1.32 nm) |
| Graphene | Graphene | Graphene | Graphene | Graphene |
| hBN (65.3 nm) | hBN (7 nm) | hBN (8.58 nm) | hBN (26.4 nm) | hBN (17.49 nm) |
| Graphene | Graphene | Graphene | Graphene | Graphene |
| hBN (51.9 nm) | hBN (9.3 nm) | hBN (33.6 nm) | hBN (5.28 nm) | hBN (22.44 nm) |
| Graphene | Graphene | Graphene | Graphene | Graphene |
| hBN (64.3 nm) | hBN (46.3 nm) | hBN (23.76 nm) | hBN (19.47 nm) | hBN (15.18 nm) |
| Graphene | Graphene | Graphene | Graphene | Graphene |
| hBN (18.3 nm) | hBN (27 nm) | hBN (36.63 nm) | hBN (46.86 nm) | hBN (2.31 nm) |
| Graphene | Graphene | Graphene | Graphene | Graphene |
| hBN (36.9 nm) | hBN (43.3 nm) | hBN (31.68 nm) | hBN (1.65 nm) | hBN (5.94 nm) |
| Graphene | Graphene | Graphene | Graphene | Graphene |
| SiC (244.6 nm) | hBN (21.6 nm) | hBN (28.38 nm) | hBN (8.25 nm) | hBN (44.55 nm) |
| Tungsten | Graphene | Graphene | Graphene | Graphene |
|  | hBN (29.6 nm) | hBN (16.83 nm) | hBN (36.96 nm) | hBN (26.07 nm) |
|  | Graphene | Graphene | Graphene | Graphene |
|  | hBN (10.9 nm) | hBN (13.2 nm) | hBN (32.01 nm) | hBN (20.46 nm) |
|  | Graphene | Graphene | Graphene | Graphene |
|  | hBN (0.33 nm) | hBN (45.87 nm) | hBN (1.65 nm) | hBN (32.34 nm) |
|  | Graphene | Graphene | Graphene | Graphene |
|  | hBN (7.3 nm) | hBN (14.85 nm) | hBN (49.83 nm) | hBN (4.29 nm) |
|  | Graphene | Graphene | Graphene | Graphene |
|  | SiC (257.6 nm) | hBN (18.48 nm) | hBN (31.3 nm) | hBN (4.58 nm) |
|  | Tungsten | Graphene | Graphene | Graphene |
|  |  | hBN (31.02 nm) | hBN (43.89 nm) | hBN (3.63 nm) |
|  |  | Graphene | Graphene | Graphene |
|  |  | hBN (38.94 nm) | hBN (12.87 nm) | hBN (45.21 nm) |
|  |  | Graphene | Graphene | Graphene |
|  |  | hBN (37.29 nm) | hBN (37.29 nm) | hBN (6.93 nm) |
|  |  | Graphene | Graphene | Graphene |
|  |  | hBN (11.55 nm) | hBN (10.56 nm) | hBN (30.36 nm) |
|  |  | Graphene | Graphene | Graphene |
|  |  | hBN (33.33 nm) | hBN (48.18 nm) | hBN (38.61 nm) |
|  |  | Graphene | Graphene | Graphene |
|  |  | hBN (42.9 nm) | hBN (27.06 nm) | hBN (33.99 nm) |
|  |  | Graphene | Graphene | Graphene |
|  |  | hBN (33.33 nm) | hBN (45.21 nm) | hBN (43.89 nm) |
|  |  | Graphene | Graphene | Graphene |
|  |  | hBN (42.9 nm) | hBN (38.61 nm) | hBN (33.99 nm) |
|  |  | Graphene | Graphene | Graphene |
|  |  | hBN (34.65 nm) | hBN (22.77 nm) | hBN (9.24 nm) |
|  |  | Graphene | Graphene | Graphene |
|  |  | SiC (176.7 nm) | hBN (36.3 nm) | hBN (11.22 nm) |
|  |  | Tungsten | Graphene | Graphene |
|  |  |  | hBN (8.58 nm) | hBN (41.92 nm) |
|  |  |  | Graphene | Graphene |
|  |  |  | hBN (0.33 nm) | hBN (30.03 nm) |
|  |  |  | Graphene | Graphene |
|  |  |  | hBN (15.18 nm) | hBN (30.03 nm) |
|  |  |  | Graphene | Graphene |
|  |  |  | hBN (30.69 nm) | hBN (26.73 nm) |
|  |  |  | Graphene | Graphene |
|  |  |  | SiC (175.1 nm) | hBN (42.9 nm) |
|  |  |  | Tungsten | Graphene |
|  |  |  |  | hBN (39.6 nm) |
|  |  |  |  | Graphene |
|  |  |  |  | hBN (43.89 nm) |
|  |  |  |  | Graphene |
|  |  |  |  | hBN (38.28 nm) |
|  |  |  |  | Graphene |
|  |  |  |  | SiC (106.5 nm) |
|  |  |  |  | Tungsten |

As can be seen in FIG. 6, the increase in the number of graphene layers 102 does not result in narrower thermal emission so that the bandwidth of the power emitted from the graphene multilayer nanostructure 600 with the smallest number of graphene layers 102, i.e., 8 graphene layers, is narrower than the one of the graphene multilayer nanostructure 608 with the largest number of graphene layers, i.e., 32 graphene layers. While this can assume a drawback of increasing the number of graphene layers 102, the strength of undesired peaks of power emitted at shorter wavelengths decreases by increasing the number of graphene layers. Even though the graphene multilayer nanostructure 600 with 8 graphene layers 102 shows better selectivity of thermal power emission than the graphene multilayer nanostructure 608 with 32 graphene layers at zero bias ($\mu_c$=0.0 eV), the increase in the number of graphene layers 102 enhances the effect of varying the chemical potential of graphene layers 102, promoting larger range of tunability and stronger switchability as discussed in the next paragraphs.

FIG. 8 depicts the normalized thermal power of each of graphene multilayer nanostructures 600 (shown in graph 8(b)), graphene multilayer nanostructures 602, (shown in thermal graph 8(c)), 604 (shown in thermal graph 8(d)), 606 (shown in thermal graph 8(e)), and 608 (shown in thermal graph 8(f)), wherein each of the nanostructures is excited in the normal direction as a function of wavelength with each of the layers of graphene. The thermal power graphs of each of the graphene multilayer nanostructures 600, 602, 604, 606, and 608 are depicted juxtaposed against the graph of the thermal power emitted from bulk tungsten at T=873° K (thermal graph 8(a)). The dotted vertical line in FIG. 8 shows the wavelength of $\lambda$=3.34 μm at which the structures are optimized, and the dash-dotted lines correspond to 0.7×max [$\bar{\mu}(\lambda)$], which is used to define the bandwidth of the emission.

Thermal graphs 8(b-f) respectively depict the effect of the increase in the chemical potential on the normalized power emitted from the five optimized graphene multilayer nanostructures 600, 602, 604, 606, and 608. As shown for the optimized graphene multilayer nanostructure 600 with 8 graphene layers in FIG. 8(b), the increase in the chemical potential results in a spectral shift towards shorter wavelengths and in narrower thermal emission. Further still, it can be seen that as the number of graphene layers 102 increases, the more pronounced the effect on the spectral shift toward wavelengths in a narrower bandwidth. That is, the larger number of graphene layers in FIGS. 8(c-f), the more pronounced the effect of chemical potential variation on the peak emission wavelength and the emission bandwidth.

With reference to FIG. 8, it can be seen that the graph 8(b) for graphene multilayer structure 600 including 8 graphene layers shows better selectivity, corresponding to narrower bandwidth, of thermal power emission than the graphene multilayer nanostructure 608 including 32 graphene layers, at zero bias ($\mu_c$=0.0 eV). It can be further seen that increasing the number of graphene layers 102 in the graphene multilayer structures 600, 602, 604, 606, and 608 enhances the effect of varying the chemical potential of graphene layers. As such, one skilled in the art will understand that graphene multilayers structures 600, 602, 604, 606, and 608, therefore, include a larger range of tunability and stronger switchability. The arrows in FIG. 8(f) show how the selectivity, tunability, and switchability are extracted from the graphs. The selectivity is obtained by measuring the bandwidth of the thermal power, the tunability is obtained by measuring the shift of peak thermal power from $\lambda$=3.34 μm to lower frequency, and the switchability is obtained by measuring the decrease in thermal power at $\lambda$=3.34 μm. The effect of altering the chemical potential of graphene layers in the graphene multilayer structures 600, 602, 604, 606, and 608 on the selectivity, tunability, and switchability are explained in FIGS. 9, 10, and 11, respectively.

In one exemplary embodiment, after obtaining an optimized graphene multilayer nanostructure 100 for $\mu_c$=0.0 eV, a user may control the chemical potential of the graphene multilayer nanostructure 100 by applying a positive DC voltage. In such a way the carrier density in the graphene layers 102 may be increased. The higher the DC voltage applied to the graphene multilayer nanostructure 100, the higher the carrier density. For example, a positive DC voltage may be used to tune the chemical potential to larger values. The increase in the chemical potential makes the intraband transition contribution comparable with the interband transition contribution and significantly changes the refractive index of graphene layers at infrared frequencies, as explained with reference to FIGS. 8(d) and 8(f). Changing the refractive, index of graphene layers alters the optical properties of the graphene multilayer nanostructure 100 enabling the selectivity, tunability, and switchability of its thermal power.

FIG. 9 is a graph depicting the effect of changing the chemical potential of the graphene layer on the bandwidth of the thermal power emitted from various optimized graphene multilayer nanostructure wherein each graphene multilayer nanostructure includes different and distinct numbers of graphene layers. What is shown is selectivity of the thermal power emitted from the optimized graphene multilayer nanostructures 600, 602, 604, 606, 608 versus chemical potential. The bandwidth $\Delta\lambda$ is measured at the wavelengths at which the normalized power emitted becomes 0.7×max [$\bar{\mu}(\lambda)$]. It can be observed that for optimized graphene multilayer nanostructures 600; 602, 604, 606, 608, the selectivity of thermal emittance in wavelength becomes stronger by increasing the chemical potential. At $\mu_c$=0.0 eV, the graphene multilayer nanostructure 600 including 8 graphene layers has the power spectrum with the narrowest bandwidth, $\Delta\lambda$=315 nm, i.e., better selectivity in wavelength, while the power emitted from the graphene multilayer nanostructure 608 with 32 graphene layers has about three times broader bandwidth. However, the larger number of graphene layers in the structure provides stronger control of the bandwidth by increasing the chemical potential. The power emitted from the graphene multilayer nanostructure 608 with 32 graphene layers becomes three times narrower, changing from $\Delta\lambda$=874 nm to 286 nm, by increasing the chemical potential from 0.0 eV to 1.0 eV, while the bandwidth of the graphene multilayer nanostructure 600 having 8 graphene layers only changes from $\Delta\lambda$=315 nm to 234 nm for the same change in the chemical potential. As such, graphene multilayer nanostructure 608 with 32 layers of graphene enables stronger selectivity for thermal emission, which is electrically controllable by tuning the chemical potential in graphene layers.

The graphene multilayer nanostructures 100 of the present invention may be tuned by controlling the chemical potential of the graphene layer 100. For example, a user may shift the normalized power emitted from graphene multilayer nanostructure 100 by increasing the chemical potential in graphene layer 100. FIG. 10 shows the effect of changing the chemical potential on the tunability of the thermal power emitted from the optimized graphene multilayer nanostructure 100 with different numbers of graphene layers 102 (i.e., graphene multilayer nanostructure 600 (including 8 graphene layers), graphene multilayer nanostructure 602 (including 13 graphene layers), graphene multilayer nanostructure 604 (including 23 graphene layers), graphene multilayer nanostructure 606 (including 28 graphene layers), and 608 (including 32 graphene layers)). As can be seen in FIG. 10, the range of tunability of graphene multilayer nanostructure 600, 602, 604 606, and 608 is increased by increasing the number of graphene layers 102. For instance, the shift of the peak emission for graphene multilayer nanostructure 608 with 32 graphene layers is ~3.5 times larger than the shift of the peak emission for graphene multilayer nanostructure 600 with 8 graphene layers. For example, the shift of the peak emissions for graphene multilayer nanostructure 608 changes from λ=3.34 μm to 2.85 μm for graphene multilayer nanostructure 600 by increasing $\mu_c$=0.0 eV to 1.0 eV. That is, the aperiodic graphene multilayer nanostructures 100 (or graphene multilayer nanostructures 600, 602, 604, 606, 608) enable a tunable thermal emitter that can be electrically controlled by changing the chemical potential in graphene layers. As noted, the chemical potential of the graphene multilayer nanostructure 100 may be controlled by a DC bias.

The graphene multilayer nanostructures 100 according to the present invention are also switchable in that the normalized power emitted may be switched off (switched to zero) or switched on. As is shown in FIG. 11, the switchability of graphene multilayer nanostructure 100 can be determined by reference to the dotted line that corresponds to the wavelength at which the structures are optimized (3340 nm). It can be observed that, for the optimized graphene multilayer nanostructure 600 with 8 graphene layers, changing the chemical potential from 0.0 eV to 1.0 eV does not result in a significant change in the normalized power emitted from the structure. However, the normalized power emitted from the optimized graphene multilayer nanostructure 608 with 32 graphene layers can be almost completely eliminated by increasing the chemical potential in this range, so that perfect emittance of unity at $\mu_c$=0.0 eV can be switched to zero by setting $\mu_c$ equal to 1.0 eV.

FIG. 10 shows the effect of changing the chemical potential on the thermal power emitted λ=3.34 μm for the optimized structures with different numbers of graphene layers. It can be observed that the normalized power emitted for all the optimized structures significantly decreases by increasing the chemical potential in graphene layer 102. For instance, by increasing the chemical potential form 0.0 eV to 1.0 eV, the normalized power emitted from graphene multilayer structure 600 with 8 graphene layers decreases by ~25%, changing from perfect value of unity to ~0.75. The range of change in thermal emission increases by increasing the number of graphene layers in the aperiodic multilayer structures, so that for the graphene multilayer nanostructure 608 with 32 graphene layers the normalized emitted power at μ=1.0 eV decreases by ~83%, which is about 4.5 times larger decrease than for the graphene multilayer nanostructure 600 with 8 graphene layers. As such, the graphene multilayer nanophotonic structures of the present enables switchable thermal emittance that can be electrically controlled by changing the chemical potential of graphene layers.

While the present invention teaches various embodiments of the invention, (i.e., graphene multilayer nanostructures, including two 2D materials, graphene and hBN, as shown in graphene multilayer nanostructure 100), alternate exemplary embodiments of the invention may include tungsten disulfide (WS$_2$) to bring new functionality, improved its performance, and extend its applications to new frequency domains and ambient temperatures. FIG. 12 shows another exemplary multilayer heterostructure of graphene multilayer nanostructure 200 ("graphene multilayer nanostructure 200") according to the present invention. Graphene multilayer nanostructure 200 includes alternating layers of graphene layer 204, and hBN layer 202, included between (i.e., "sandwiched between") two tungsten disulfide (WS$_2$) layers 206, and deposited over silicon substrate. In one particular embodiment, at least one graphene layer 204 is in contact with at least one WS$_2$ layer 206. The structure is optimized using the genetic optimization algorithm discussed above with respect to graphene multilayer nanostructure 100 to enable multilayer absorber 200 to be electrically switchable at room temperature. That is, the genetic optimization algorithm discussed above may be used to determine the thickness of each layer, and the number of layers required so that the multilayer absorber 200 is completely aperiodic.

Table 2 depicts the exemplary thickness of each of the graphene layers 204, hBN layers 202, and WS$_2$ layers 206.

TABLE 2

| Optimized Structure with 32 Layers of Graphene |
|---|
| WS2 (65 nm) |
| Graphene |
| hBN (33 nm) |
| Graphene |
| hBN (19.1 nm) |
| Graphene |
| hBN (12.5 nm) |
| Graphene |
| hBN (62.8 nm) |
| Graphene |
| hBN (19.4 nm) |
| Graphene |
| hBN (48 nm) |
| Graphene |
| hBN (9.9 nm) |
| Graphene |
| hBN (45.1 nm) |
| Graphene |
| hBN (55 nm) |
| Graphene |
| hBN (62.1 nm) |
| Graphene |
| hBN (62.7 nm) |
| Graphene |
| hBN (27.3 nm) |
| Graphene |
| hBN (0.66 nm) |
| Graphene |
| hBN (13.4 nm) |
| Graphene |
| hBN (38.5 nm) |
| Graphene |
| hBN (21 nm) |
| Graphene |
| hBN (7.9 nm) |
| Graphene |
| hBN (28 nm) |
| Graphene |
| hBN (6.1 nm) |
| Graphene |
| hBN (20 nm) |
| Graphene |
| hBN (59.4 nm) |
| Graphene |
| hBN (47.5 nm) |
| Graphene |
| hBN (14.7 nm) |
| Graphene |
| hBN (20.2 nm) |
| Graphene |
| hBN (5.2 nm) |
| Graphene |
| hBN (20.5 nm) |
| Graphene |
| hBN (55.3 nm) |
| Graphene |
| hBN (20.1 nm) |
| Graphene |
| hBN (9.65 nm) |
| Graphene |
| hBN (56.9 nm) |
| Graphene |
| hBN (22.6 nm) |
| Graphene |
| WS2 (106.5 nm) |
| Silicon |

FIG. 13 shows the absorptance of graphene multilayer nanostructure 200 with a thickness of 65 nm for the top $WS_2$, wherein graphene multilayer nanostructure 200 having 32 hBN/graphene layers, and thickness of 54 nm for the bottom $WS_2$. It can be seen that graphene multilayer nanostructure 200 exhibits perfect absorptance at λ=3.34 µm. In our optimization simulations, the wavelength is kept the same as thermal emitter applications described in this section, but refractive indices of the materials in graphene multilayer nanostructure 200 including graphene, are taken at room temperature. It can be observed from FIG. 12 that the almost perfect absorptance for µ=0.0 eV decreases by ~97% for µ=1.0 eV. As such, this is a promising structure to completely shut down the absorption by changing the chemical potential in graphene, resulting in an electrically in-situ switchable absorber.

Although the present invention has been described with respect to an emitter, one skilled in the art will understand that the invention applies to absorbers of the same construction. Moreover, traditional methods of exciting graphene-based structures are known by those skilled in the art. Further, still, traditional methods of measuring the thermal temperatures emitted/absorbed nanostructures are well known. Even further, traditional methods of DC biasing such structures are similarly well known. As such, the conventional methods of exciting and DC biasing graphene multilayer nanostructures are not described herein.

We claim:

1. An aperiodic graphene multilayer nanostructure comprising:
    a. a support substrate comprised of tungsten (W), wherein the tungsten substrate includes a planar surface;
    b. a first silicon carbide (SiC) layer in contact with the tungsten substrate planar surface, wherein the first silicon carbide layer includes a planar surface;
    c. n number of graphene layers alternated with (n−1) number of hexagonal boron nitride (hBN) layers, wherein at least one of the n number of graphene layers is in contact with the first silicon carbide layer planar surface, wherein at least one of the n number of graphene layers includes a planar surface, wherein each one of the n number of graphene layers includes a distinct thickness; wherein each one of the (n−1) number of hexagonal boron nitride layers includes a distinct thickness, and
    d. a second silicon carbide layer in contact with the at least one of the n number of graphene layers planar surface, wherein the second silicon carbide layer is in contact with air.

2. An aperiodic graphene multilayer nanostructure, according to claim 1, wherein a genetic optimization algorithm is used to determine, the number of n number of graphene layers, and the distinct thickness for each of the n number of graphene layers, to ensure that graphene multilayer nanostructure has a perfect absorption efficiency of unity at infrared frequencies.

3. An aperiodic graphene multilayer nanostructure, according to claim 2, wherein a genetic optimization algorithm is used to determine, the distinct thickness for each of the (n−1) number of hexagonal boron nitride layers to ensure that graphene multilayer nanostructure has a perfect absorption efficiency of unity at infrared frequencies.

4. An aperiodic graphene multilayer nanostructure according to claim 3, wherein the n, the number of graphene layers, the distinct thickness for each of the n number of graphene layers, and the thickness of each (n−1) number of hexagonal boron nitride layers is determined simultaneously.

5. An aperiodic graphene multilayer nanostructure, according to claim 4, wherein the number of, the distinct thickness for each of the (n−1) number of hexagonal boron nitride layers to ensure that graphene multilayer nanostructure has a perfect absorption efficiency of unity at infrared frequencies.

6. An aperiodic graphene multilayer nanostructure, according to claim 5, wherein the graphene multilayer nanostructure is tuned to lower frequencies by changing the chemical potential each of the n number of graphene layers.

7. An aperiodic graphene multilayer nanostructure, according to claim 6, wherein a DC bias is applied to each of the n number of graphene layers to change the chemical potential of each of the n number of graphene layers.

8. An aperiodic graphene multilayer nanostructure, according to claim 5, wherein the graphene multilayer nanostructure is switched by changing the chemical potential each of the n number of graphene layers.

9. An aperiodic graphene multilayer nanostructure, according to claim 8, wherein a DC bias is applied to each of the n number of graphene layers to change the chemical potential of each of the n number of graphene layers.

10. An aperiodic graphene multilayer nanostructure, according to claim 9, wherein the graphene multilayer nanostructure is switched to lower the intensity of absorption/emittance at the optimized peak frequency, by changing the chemical potential of each of the n number of graphene layers.

* * * * *